US012660707B2

(12) United States Patent
Tsai et al.

(10) Patent No.: US 12,660,707 B2
(45) Date of Patent: Jun. 16, 2026

(54) SEMICONDUCTOR DEVICE INCLUDING MOLDED DIE STACK AND METHODS OF FORMING THE SAME

(71) Applicant: Taiwan Semiconductor Manufacturing Company Limited, Hsinchu (TW)

(72) Inventors: Tsung-Fu Tsai, Changhua City (TW); Chen-Hua Yu, Hsinchu City (TW); Szu-Wei Lu, Hsinchu City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 487 days.

(21) Appl. No.: 18/304,591

(22) Filed: Apr. 21, 2023

(65) Prior Publication Data

US 2024/0153916 A1 May 9, 2024

Related U.S. Application Data

(60) Provisional application No. 63/422,930, filed on Nov. 5, 2022.

(51) Int. Cl.
*H10W 90/00* (2026.01)
*H10W 20/20* (2026.01)
(Continued)

(52) U.S. Cl.
CPC ........... *H10W 90/00* (2026.01); *H10W 20/20* (2026.01); *H10W 74/016* (2026.01);
(Continued)

(58) Field of Classification Search
CPC ..... H01L 25/0657; H01L 24/05; H01L 24/08; H01L 24/80; H01L 2224/08145;
(Continued)

(56) References Cited

U.S. PATENT DOCUMENTS 9,773,757 B2 * 9/2017 Yu ........................... H01L 24/19
12,322,731 B2 * 6/2025 Kim .................... H01L 25/0657
(Continued)

FOREIGN PATENT DOCUMENTS

TW 202220098 A 5/2022

OTHER PUBLICATIONS

TW Patent and Trademark Office; TW Application No. 112122939; Office Action mailed Jul. 10, 2024; 18 pages.
TW Patent and Trademark Office; TW Application No. 112122939; Office Action mailed Nov. 27, 2024; 18 pages.

*Primary Examiner* — Mamadou L Diallo
(74) *Attorney, Agent, or Firm* — The Marbury Law Group, PLLC

(57) ABSTRACT

A semiconductor device includes a bottom semiconductor die including a bottom semiconductor die sidewall, a top semiconductor die bonded to the bottom semiconductor die and including a top semiconductor die sidewall, and a molding material layer formed on an upper surface of the bottom semiconductor die, on the top semiconductor die sidewall, and on the bottom semiconductor die sidewall. A method of forming a semiconductor device includes mounting a bottom semiconductor die including a bottom semiconductor die sidewall on a carrier substrate, mounting a top semiconductor die including a top semiconductor die sidewall on the bottom semiconductor die, and forming a molding material layer on an upper surface of the bottom semiconductor die, on the top semiconductor die sidewall, and on the bottom semiconductor die sidewall.

20 Claims, 33 Drawing Sheets

(51) Int. Cl.

| | |
|---|---|
| *H10W 72/90* | (2026.01) |
| *H10W 74/01* | (2026.01) |
| *H10W 74/10* | (2026.01) |
| *H10W 80/00* | (2026.01) |
| *H10W 90/20* | (2026.01) |

(52) U.S. Cl.

CPC ........ *H10W 74/117* (2026.01); *H10W 72/942* (2026.01); *H10W 80/327* (2026.01); *H10W 90/297* (2026.01); *H10W 90/792* (2026.01)

(58) Field of Classification Search

CPC ................. H01L 21/565; H01L 23/481; H01L 2224/0557; H01L 2225/06541; H01L 21/76898

See application file for complete search history.

(56) References Cited

U.S. PATENT DOCUMENTS

| | | | | |
|---|---|---|---|---|
| 2021/0132310 | A1* | 5/2021 | Yu | G02B 6/4243 |
| 2021/0327807 | A1* | 10/2021 | Chen | H01L 25/0657 |
| 2022/0077117 | A1* | 3/2022 | Yu | H01L 21/76898 |
| 2022/0165707 | A1 | 5/2022 | Song et al. | |
| 2022/0208731 | A1 | 6/2022 | Pu et al. | |
| 2022/0223557 | A1 | 7/2022 | Chen et al. | |
| 2022/0293483 | A1* | 9/2022 | Tsai | H01L 23/3135 |
| 2023/0065941 | A1* | 3/2023 | Tsai | H01L 21/568 |
| 2023/0068435 | A1* | 3/2023 | Kao | H01L 23/481 |
| 2023/0110531 | A1* | 4/2023 | Shih | H01L 23/3171 |
| | | | | 438/106 |
| 2024/0170464 | A1* | 5/2024 | Jo | H01L 23/49822 |
| 2025/0125273 | A1* | 4/2025 | Lin | H01L 24/08 |

* cited by examiner

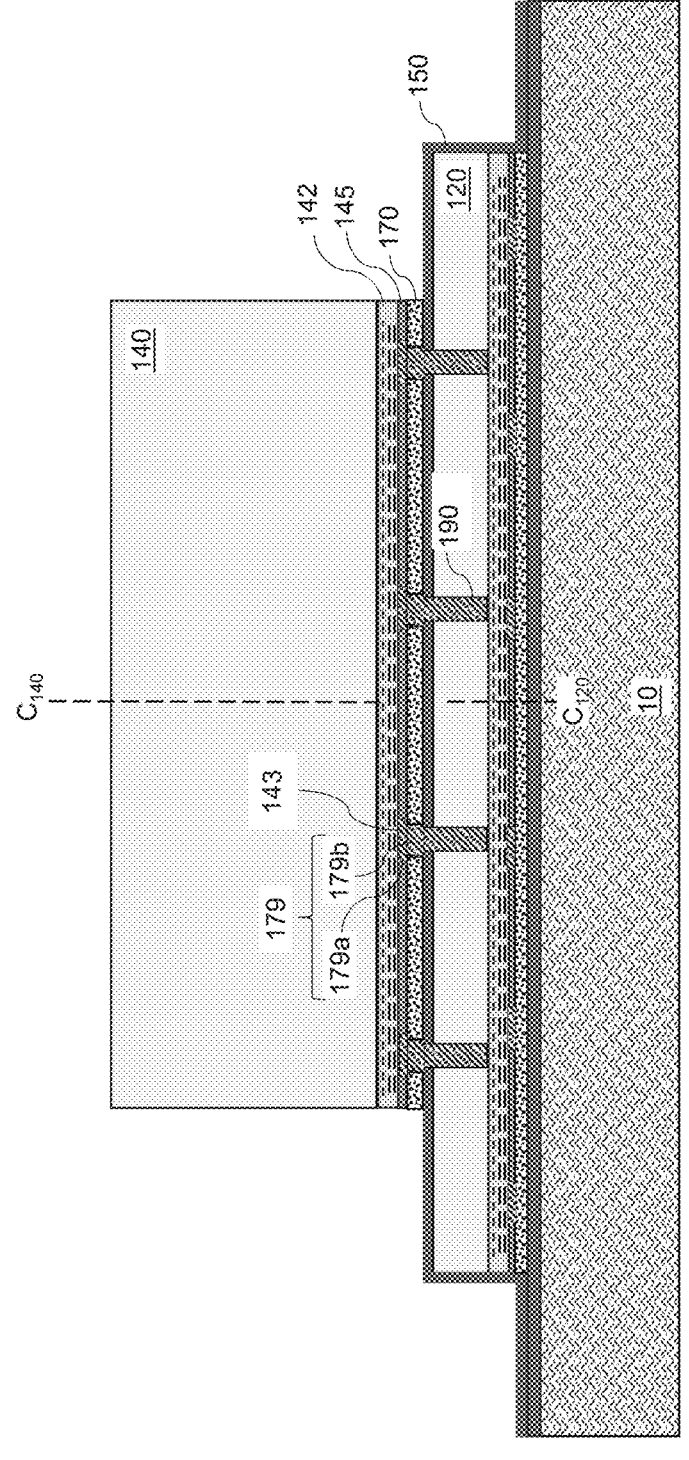
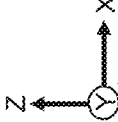
FIG. 2D

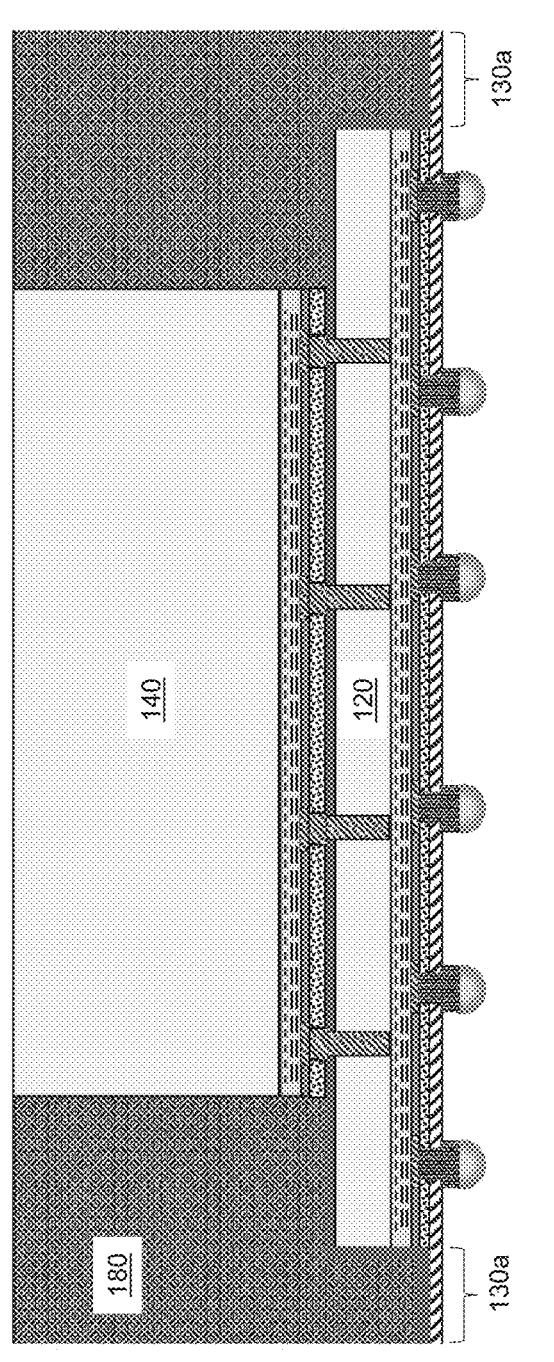
100
180
140
120
130a
130a
FIG. 21
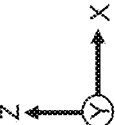

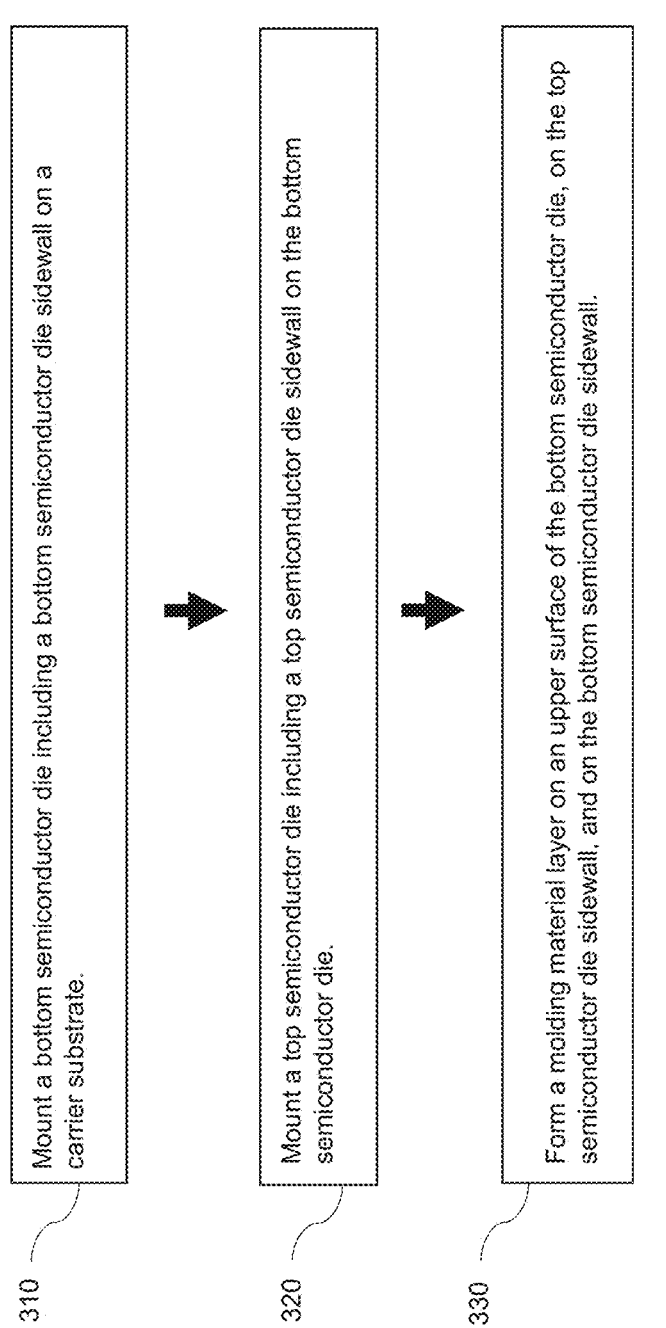

310 — Mount a bottom semiconductor die including a bottom semiconductor die sidewall on a carrier substrate.

320 — Mount a top semiconductor die including a top semiconductor die sidewall on the bottom semiconductor die.

330 — Form a molding material layer on an upper surface of the bottom semiconductor die, on the top semiconductor die sidewall, and on the bottom semiconductor die sidewall.

FIG. 3

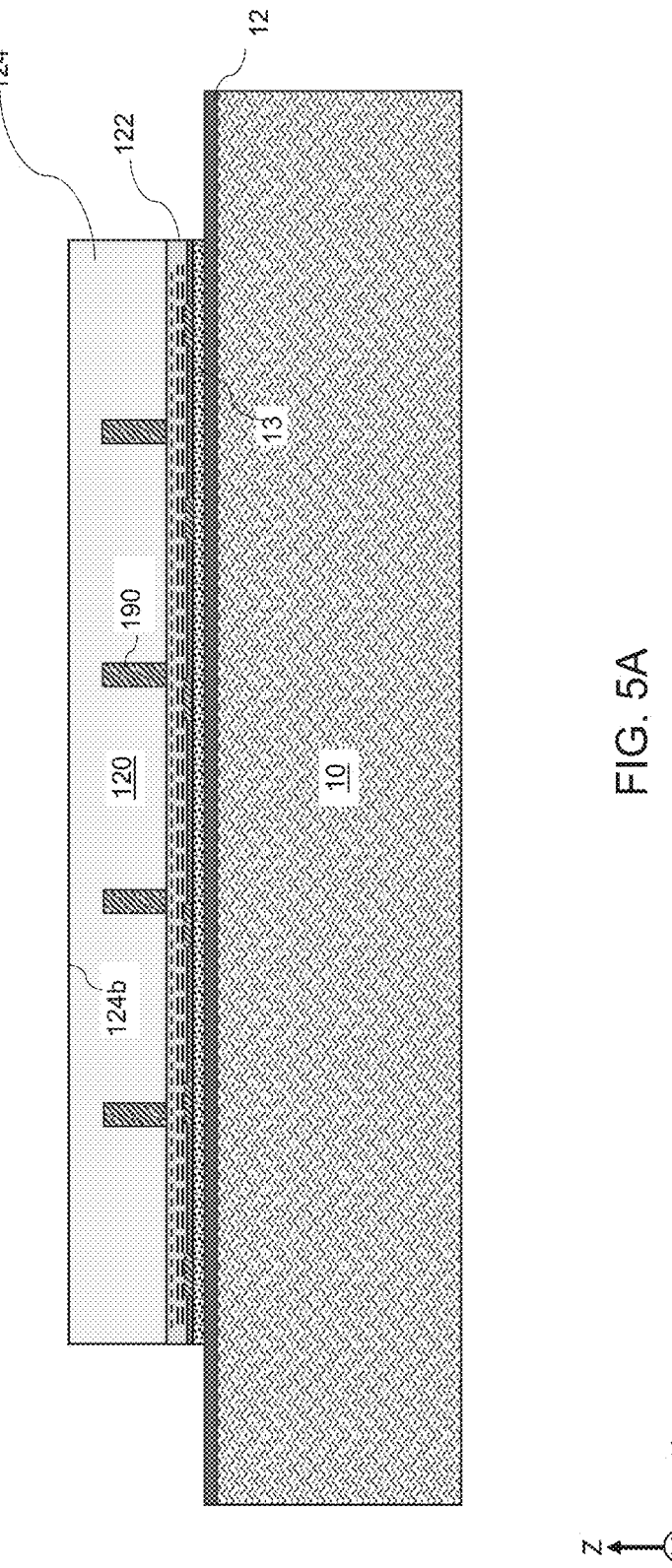
FIG. 5A
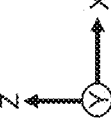

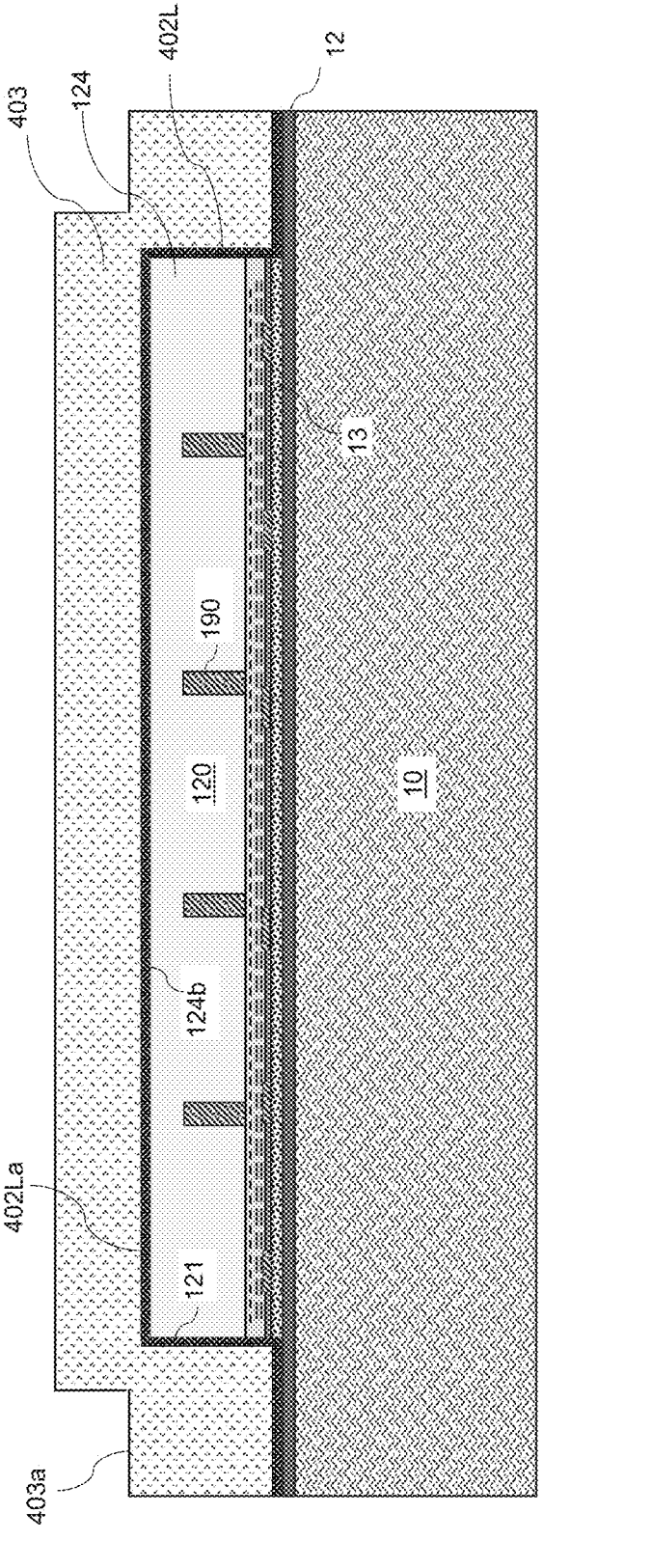
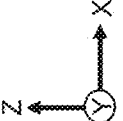
FIG. 5B

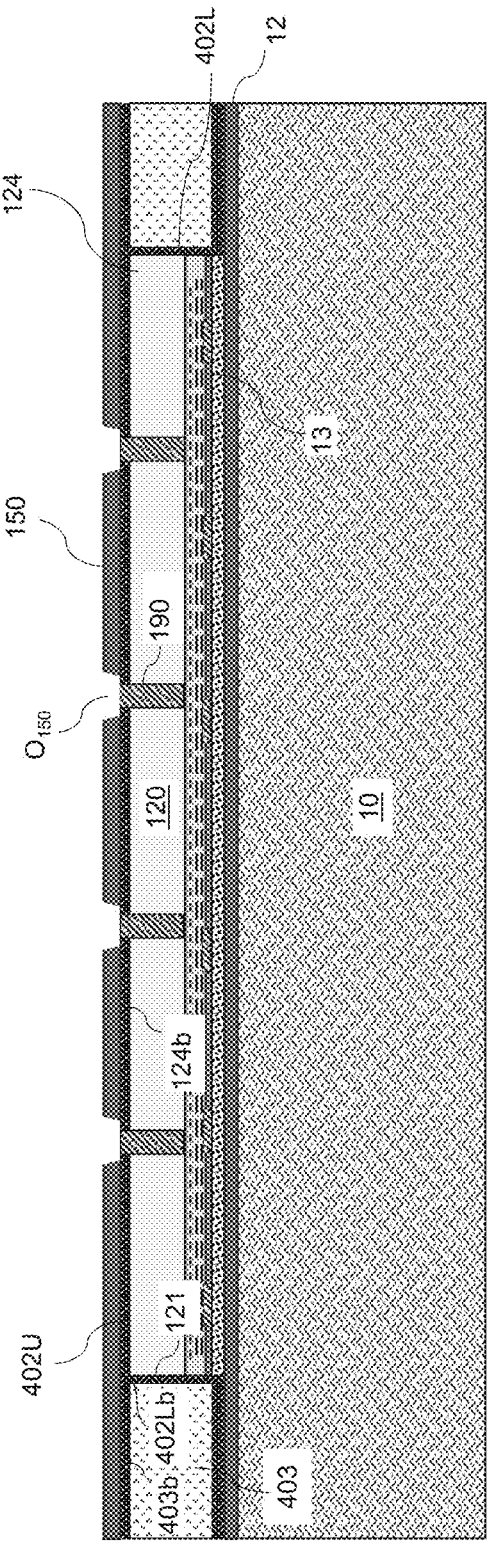
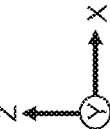
FIG. 5D

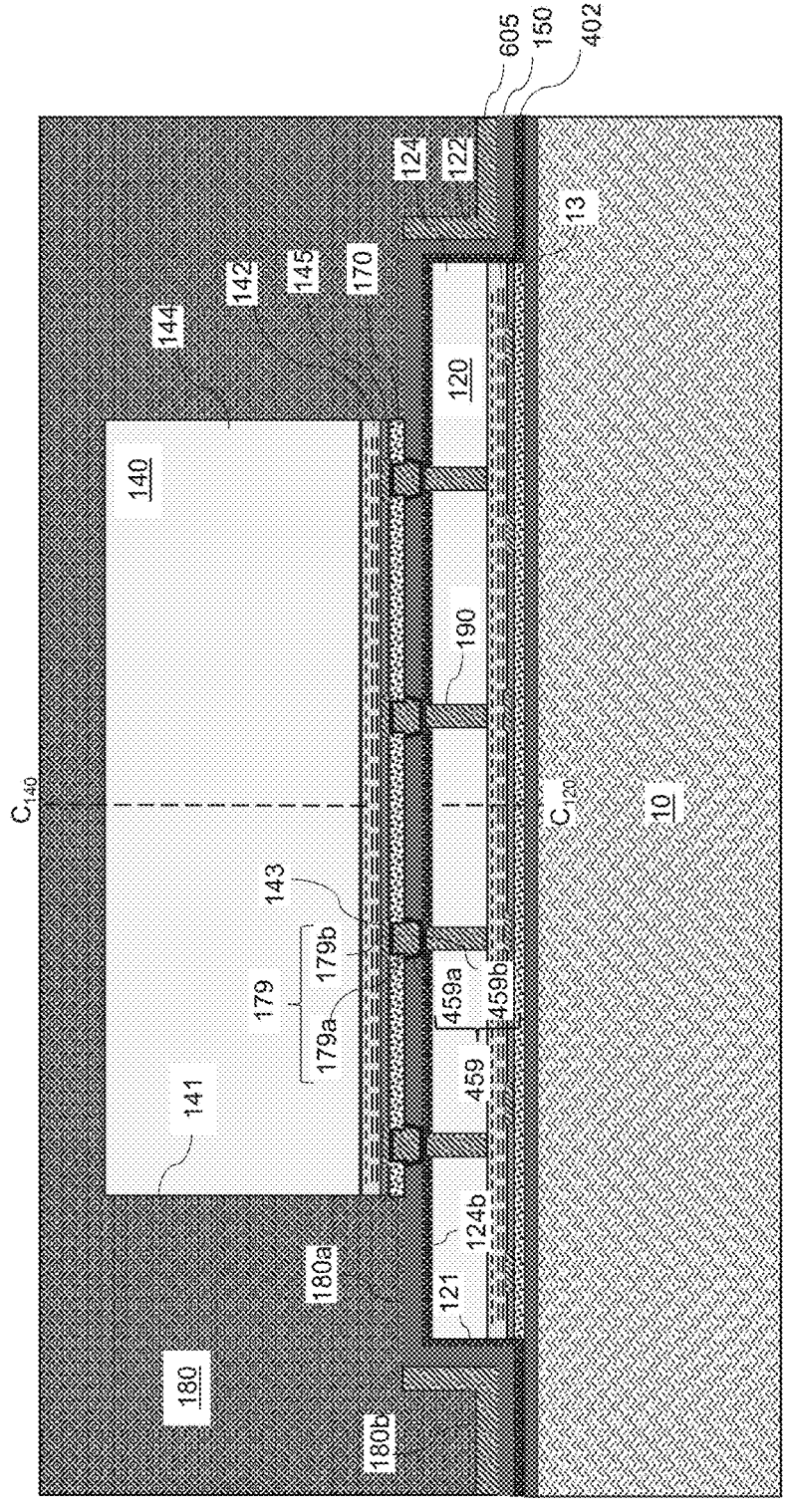
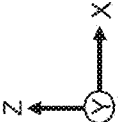
FIG. 7G 130
402
180b
180
139
139b
139a
120
125
123
13
402
180b
140
20

SEMICONDUCTOR DEVICE INCLUDING MOLDED DIE STACK AND METHODS OF FORMING THE SAME

RELATED APPLICATIONS

This application claims priority from U.S. Provisional Application Ser. No. 63/422,930 entitled "Semiconductor Device Including Molded Die Stack And Methods Of Forming The Same," filed on Nov. 5, 2022, the entire contents of which are incorporated herein by reference for all purposes.

BACKGROUND

A semiconductor die may include a face side that may include an active region. The active region may include, for example, logic circuitry, memory circuitry, etc. The semiconductor die may also include a back side opposite the face side.

A semiconductor device (e.g., system on integrated chips (SoIC) device) may include a stack of semiconductor dies. The stack may include, for example, a face-to-back (F2B) stacking of the semiconductor dies in which a face side of a top semiconductor die may face a back side of a bottom semiconductor die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2D is a vertical cross-sectional view of the top die mounted on the bottom die, according to one or more embodiments.

FIG. 2I is a vertical cross-sectional view of the intermediate structure after singulation according to one or more embodiments.

FIG. 3 is a flow chart illustrating a method of forming a semiconductor device, according to one or more embodiments.

FIG. 5A is a vertical cross-sectional view of an intermediate structure including a bottom die having a thinned bottom die bulk semiconductor region, according to one or more embodiments.

FIG. 5B is a vertical cross-sectional view of an intermediate structure including a layer of gap fill lower material formed on the bottom die and the first carrier substrate, according to one or more embodiments.

FIG. 5D is a vertical cross-sectional view of an intermediate structure including the bonding dielectric layer, according to one or more embodiments.

FIG. 7G is a vertical cross-sectional view of the molding material layer on the top die and the bottom die, according to one or more embodiments.

FIG. 7I is a vertical cross-sectional view of the intermediate structure after singulation and thinning the molding material layer according to one or more embodiments.

DETAILED DESCRIPTION

Figure 1A:
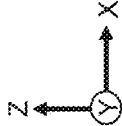
FIG. 1A is a vertical cross-sectional view of a semiconductor device according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Currently, a semiconductor device having an F2B stacking (e.g., an SoIC F2B device) may utilize a thick support silicon layer (e.g., silicon wafer) by wafer-on-wafer (WoW) bonding. However, a semiconductor device having such a structure may have a poor thermal performance. In addition, the semiconductor device may have a high cost due to the relatively high cost of WoW processing.

At least one embodiment of the present disclosure may include a semiconductor device (e.g., SoIC F2B device) that may include a semiconductor die stack including a semiconductor die with a large thickness. The semiconductor device may also include a molding material layer on the semiconductor die stack. The molding material layer may provide rigidity and support to the semiconductor die stack. The semiconductor device and method of making the semiconductor device may be especially applicable to a 2.5/3D advanced package. In particular, the semiconductor device may be utilized in a high performance computing (HPC) application, an artificial intelligence (AI) application, and a 5G cellular network application.

Various embodiment semiconductor devices may achieve good thermal dispersion and a may be made using a simplified manufacturing process. In particular, the molding material layer may have a high thermal conductivity (e.g., greater than a thermal conductivity of silicon). In at least one embodiment, the thermal conductivity of the molding material layer may be greater than about 2.8 W/m·K. Thus, the various embodiment semiconductor devices may have an improved thermal performance. The various embodiment semiconductor devices may also utilize a molding process (e.g., a one-time molding process). Further, the various embodiment semiconductor devices may be manufactured without WoW processing. This may result in decreased fabrication costs for the various embodiment semiconductor devices.

Further, in instances in which a thick oxide layer is filled in a die gap, then a high film stress may occur. This high film stress may cause an increased warpage and film crack. For example, it may be difficult to achieve a chemical vapor deposition (CVD) oxide film having a thickness greater than 100 microns. Thus, in a related method, the desired molding material layer (molding compound or compression molding compound (CMC)) may not be achieved since there may be one or more high temperature processes, a CVD oxide, and supporting silicon fusion bonding after the molding material layer is formed. Organic materials would likely contaminate the CVD chamber and may not survive in further high temperature processes.

FIG. 1A is a vertical cross-sectional view of a semiconductor device 100 according to one or more embodiments. As illustrated in FIG. 1A, the semiconductor device 100 may include a bottom die 120 (bottom semiconductor die) and a top die 140 (top semiconductor die) mounted on the bottom die 120. The semiconductor device 100 may also include a molding material layer 180 on the bottom die 120 and the top die 140. In particular, the molding material layer 180 may surround the top die 14 in the x-y plane.

The semiconductor device 100 may include, for example, a semiconductor chip or chiplet for a high performance computing (HPC) application, an artificial intelligence (AI) application, and a 5G cellular network application. In at least one embodiment, the bottom die 120 or the top die 140 may include a logic die, and the other of the bottom die 120 or the top die 140 may include a memory die (e.g., static random access memory (SRAM)). In at least one embodiment, the bottom die 120 may include a central processing unit (CPU) chip, graphics processing unit (GPU) chip, field-programmable gate array (FPGA) chip, networking chip, application-specific integrated circuit (ASIC) chip, artificial intelligence/deep neural network (AI/DNN) accelerator chip, etc., and the top die 140 may work as a co-processor, accelerator, or on-chip memory buffer for the bottom die 120.

The bottom die 120 may include, for example, a bottom die active region 122. Referring to the inset in FIG. 1A, the bottom die active region 122 may include a front end of line (FEOL) region 122a including electronic circuitry including various electronic devices (e.g., transistors, resistors, etc.). In particular, the FEOL region 122a may include one or more logic circuits including logic devices (e.g., logic gates) and/or one or more memory circuits including memory devices (e.g., volatile memory (VM) devices and/or non-volatile memory (NVM) devices).

The bottom die active region 122 may also include a back end of line (BEOL) region 122b that may include interlayer dielectric having a plurality of dielectric layers. The dielectric layers may include, for example, $SiO_2$, a dielectric polymer or other suitable dielectric material. The interlayer dielectric may include one or more metal interconnect structures 122c formed therein. The metal interconnect structures 122c may include metal traces and metal vias formed in the dielectric layers and provide an electrical connection to the electronic circuitry in the FEOL region 122a. (e.g., logic devices, memory devices, etc.). The metal interconnect structures 122c may include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

The bottom die 120 may also include a bottom die bulk semiconductor region 124 (e.g., substrate) on the bottom die active region 122. The bottom die bulk semiconductor region 124 may include, for example, silicon, germanium, silicon germanium, or other suitable semiconductor material.

The side of the bottom die 120 including the bottom die active region 122 may be referred to as the "face side" of the bottom die 120. The side of the bottom die 120 including the bottom die bulk semiconductor region 124 may be referred to as the "back side" of the bottom die 120. In the semiconductor device 100, relative to the top die 140, the bottom die 120 may be described as having an inverted orientation. That is, the bottom die 120 may be arranged so that the face side is on a side of the bottom die 120 that is opposite the top die 140. It may be said, for example, that the bottom die 120 "faces away" from the top die 140.

The bottom die bulk semiconductor region 124 may include one or more through silicon vias (TSVs) 190 that may be connected to the bottom die active region 122. The TSVs 190 may also extend through the bottom die bulk semiconductor region 124 and protrude from the upper surface 124b of the bottom die bulk semiconductor region 124 (e.g., upper surface of the bottom die 120). In particular, the TSVs 190 may extend through the FEOL region 122a of the bottom die active region 122, and contact the metal interconnect structures 122c in the BEOL region 122b of the bottom die active region 122. The TSVs 190 may include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

The bottom die 120 may also include one or more bottom die contact pads 123 on a surface of the bottom die active region 122. In particular, the bottom die contact pads 123 may be formed on a surface of the BEOL region 122b and contact the metal interconnect structures 122c in the BEOL region 122b of the bottom die active region 122. The bottom die contact pads 123 may include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

The bottom die 120 may also include a bottom die passivation layer 125 on the surface of the bottom die active region 122. In particular, the bottom die passivation layer 125 may be formed on the surface of the BEOL region 122b and may at least partially cover the bottom die contact pads 123. The bottom die passivation layer 125 may include silicon oxide, silicon nitride, low-k dielectric materials such as carbon-doped oxides, extremely low-k dielectric materials such as porous carbon doped silicon dioxide, a combination thereof or other suitable material.

The semiconductor device 100 may also include a protective layer 130 on the bottom die passivation layer 125 (e.g., through a bonding layer 13 used to bond the bottom die 120 to a carrier substrate during processing). The protective layer 130 may extend laterally (e.g., in the x-direction and/or y-direction) away from the bottom die 120. In particular, the protective layer 130 may include a protective layer extending portion 130a that extends laterally by a distance that is at least 5% of the width of the bottom die 120 in a direction of the distance. Thus, for example, a total width of the protective layer 130 in the x-direction may be at least 10% greater than (i.e., 2×5% greater than) a width of the bottom die 120 in the x-direction.

The protective layer 130 may include, for example, a solder mask layer (solder resist layer). The protective layer 130 may include, for example, an organic material (e.g., dielectric polymer material) such as polyimide (PI), benzo-cyclobutene (BCB), or polybenzobisoxazole (PBO). The bottom die contact pads 123 may be exposed through openings in the protective layer 130 and the bonding layer 13.

The semiconductor device 100 may also include one or more C4 bumps 139 on the face side of the bottom die 120. The C4 bumps 139 may be used to mount the semiconductor device 100 onto a substrate such as package substrate or printed circuit board (PCB). The C4 bumps 139 may include, for example, a copper pillar 139a that contacts the bottom die contact pad 123 through the opening in the protective layer 130 and bonding layer 13. The copper pillar 139a may have a circular cylindrical shape, square cylindrical shape, etc. Other suitable copper pillar cross sectional shapes are within the contemplated scope of disclosure. The copper pillar 139a may include copper and, additionally or alternatively, copper alloys containing minor amounts of elements such as tantalum, indium, tin, zinc, manganese, chromium, titanium, germanium, strontium, platinum, magnesium, aluminum or zirconium. Other suitable metal materials are within the contemplated scope of disclosure.

The C4 bumps 139 may also include a solder layer 139b (e.g., a solder ball) on the copper pillar 139a. The solder layer 139b may include a standard solder material (e.g., SAC304 or SAC405). The solder material may include a lead-free solder material. The solder material may include tin and one or more other elements such as silver, indium, antimony, bismuth, zinc, etc. Other suitable solder materials are within the contemplated scope of disclosure.

The semiconductor device 100 may include a bonding dielectric layer 150 on the bottom die 120. The bonding dielectric layer 150 may be located on the upper surface 124b of the bottom die bulk semiconductor region 124. The TSVs 190 that protrude through the upper surface 124b of the bottom die bulk semiconductor region 124 may be located in the bonding dielectric layer 150. An upper surface of the TSVs 190 may be substantially co-planar with an upper surface of the bonding dielectric layer 150.

The bonding dielectric layer 150 may include a bonding dielectric layer sidewall portion contacting the bottom die sidewall 121. In particular, the bonding dielectric layer 150 may be located on the bottom die sidewall 121 that may include a sidewall of the bottom die active region 122, a sidewall of the bottom die bulk semiconductor region 124, and a sidewall of the bottom die passivation layer 125. The bonding dielectric layer 150 may also be located on protective layer extending portion 130a. The bonding dielectric layer 150 may have a substantially uniform thickness. The bonding dielectric layer 150 may include, for example, an oxide such as silicon oxide or binding polymers, such as an epoxy, a polyimide (PI), a benzocyclobutene (BCB), and a polybenzoxazole (PBO). Other suitable dielectric materials are within the contemplated scope of disclosure.

The top die 140 may be mounted on the back side of the bottom die 120 and electrically connected to the TSVs 190 in the bottom die 120. The top die 140 may be mounted on the bottom die 120 so as to be substantially aligned with the bottom die 120. In particular, a centerline $C_{140}$ of the top die 140 may be substantially aligned in the z-direction with a centerline $C_{120}$ of the bottom die 120. Similar to the bottom die 120, the top die 140 may include a top die active region 142 and a top die bulk semiconductor region 144 on the top die active region 142.

However, a width of the top die 140 in the x-direction and/or y-direction may be less than a width (in either or both the x-direction and/or y-direction) of the bottom die 120. In particular, the width of the top die 140 may be 80% of the width of the bottom die 120. In addition, the top die 140 may be a thick die. A thickness of the top die 140 may depend, for example, on thermal and warpage considerations. In particular, a thickness of the top die 140 may be greater than a thickness of the bottom die 120 and, in at least one embodiment, the thickness of the top die 140 may be at least twice a thickness of the bottom die 120. Moreover, the thickness in the top die 140 may be due to a thickness of the top die bulk semiconductor region 144. That is, a thickness of the top die active region 142 may be substantially the same as a thickness of the bottom die active region 122. However, a thickness of the top die bulk semiconductor region 144 may be greater than the thickness of the bottom die bulk semiconductor region 124 and, in at least one embodiment, the thickness of the top die bulk semiconductor region 144 may be at least twice the thickness of the bottom die bulk semiconductor region 124.

The top die active region 142 may have a configuration similar to the bottom die active region 122 shown in the inset of FIG. 1A. That is, the top die active region 142 may include an FEOL region including electronic circuitry including various electronic devices (e.g., transistors, resistors, etc.). The top die active region 142 may also include a BEOL region that may include interlayer dielectric having a plurality of dielectric layers and metal interconnect structures may include metal traces and metal vias formed in the dielectric layers to provide an electrical connection to the electronic circuitry in the FEOL region.

The top die bulk semiconductor region 144 (e.g., substrate) may be similar to the bottom die bulk semiconductor region 124. The top die bulk semiconductor region 144 may or may not include TSVs similar to the TSVs 190 in the bottom die 120. The top die bulk semiconductor region 144 may include, for example, silicon, germanium, silicon germanium, or other suitable semiconductor material.

The side of the top die 140 including the top die active region 142 may be referred to as the "face side" of the top die 140. The side of the top die 140 including the top die bulk semiconductor region 144 may be referred to as the "back side" of the top die 140. The top die 140 may be arranged so that the face side of the top die 140 faces the back side of the bottom die 120. Thus, it may be said that the top die 140 is stacked on the bottom die 120 in a face-to-back (F2B) stacking configuration.

The top die 140 may also include one or more top die contact pads 143 on a surface of the top die active region 142. In particular, the top die contact pads 143 may be formed on a surface of the BEOL region and contact the metal interconnect structures in the BEOL region of the top die active region 142. The top die contact pads 143 may include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

The top die 140 may also include a top die passivation layer 145 on the surface of the top die active region 142. In particular, the top die passivation layer 145 may be formed on the surface of the BEOL region and may at least partially cover the top die contact pads 143. The top die passivation layer 145 may include silicon oxide, silicon nitride, low-k dielectric materials such as carbon-doped oxides, extremely low-k dielectric materials such as porous carbon doped silicon dioxide, a combination thereof or other suitable material.

The semiconductor device 100 may also include a bonding layer 170 (e.g., oxide bonding layer) on the top die passivation layer 145. The bonding layer 170 may be bonded (by an oxide-oxide bond) to the bonding dielectric layer 150. The bonding layer 170 may have a substantially uniform thickness. The bonding layer 170 may include a material that is substantially similar to the material in the bonding dielectric layer 150. In particular, the bonding layer 170 may include an oxide such as silicon oxide or binding polymers, such as an epoxy, a polyimide (PI), a benzocyclobutene (BCB), and a polybenzoxazole (PBO). Other suitable dielectric materials are within the contemplated scope of disclosure. The top die contact pads 143 may be exposed through openings in the bonding layer 170.

The semiconductor device 100 may also include top die bonding pads 179 (top semiconductor die bonding pads) on the face side of the top die 140. The top die bonding pads 179 may be used to electrically connect the top die 140 to the TSVs 190 of the bottom die 120. The top die bonding pads 179 may have a width (e.g., in the x-direction and/or y-direction) that is greater than a width (diameter) of the TSVs 190. The top die bonding pads 179 may include, for example, a metallization layer 179a that contacts the top die contact pad 143 through an opening in the bonding layer 170. The metallization layer 179a may include, for example, a diffusion barrier layer and a seed layer. The diffusion barrier layer may contact the top die contact pads 143 and include, for example, tantalum nitride, titanium nitride, tantalum, titanium, or the like. The seed layer may be formed on the diffusion barrier layer and include, for example, copper, silver, chromium, nickel, tin, gold, and combinations thereof. A bottom surface of the metallization layer 179a may be substantially coplanar with a bottom surface of the bonding layer 170.

The top die bonding pads 179 may also include a metal layer 179b on the metallization layer 179a. The metal layer 179b may include, for example, copper or another suitable metal (e.g., silver, chromium, nickel, tin, tungsten, titanium, gold, etc.), a copper alloy, or other suitable metal alloy. A bottom surface of the metal layer 179b may be substantially coplanar with the bottom surface of the bonding layer 170 and with the bottom surface of the metallization layer 179a. The top die bonding pads 179 may be bonded (e.g., metal-metal bonded) to the TSVs 190. Thus, the top die 140 may be bonded to the bottom die 120 by a "hybrid" bond that includes the oxide-oxide bond between the bonding layer 170 and the bonding dielectric layer 150 and a metal-metal bond between the top die bonding pads 179 and the TSVs 190.

The molding material layer 180 may be located on the bottom die 120 and the top die 140. As illustrated in FIG. 1A, the molding material layer 180 may contact the top die sidewall 141 that may include a sidewall of the top die active region 142, a sidewall of the top die bulk semiconductor region 144, and a sidewall of the top die passivation layer 145.

The molding material layer 180 may also contact the bonding dielectric layer 150. In particular, the molding material layer 180 may include a first lower face 180a that contacts the upper surface of the bonding dielectric layer 150 over the bottom die 120. The molding material layer 180 may include a second lower face 180b that contacts the upper surface of the bonding dielectric layer 150 over the protective layer extending portion 130a. The molding material layer 180 may also contact the bonding dielectric layer 150 (e.g., bonding dielectric layer sidewall portion) that is on the bottom die sidewall 121.

The molding material layer 180 include, for example, a compression molding compound (CMC). In particular, the molding material layer 180 may include a bulk molding compound that may be either a thermoset resin or a thermoplastic resin. The molding material layer 180 may include an epoxy resin, a polyether ether ketone (PEEK) resin, a polyphenyl sulfide (PPS) resin, etc. The molding material layer 180 may also include a thermally conductive material for increasing a thermal conductivity of the molding material layer 180. The thermally conductive material may include an electrically resistant material. In at least one embodiment, the thermally conductive material may include a ceramic material. In at least one embodiment, the molding material layer 180 may include an electrically resistant ceramic-based epoxy layer.

Thus, the molding material layer 180 include may have a thermal conductivity greater than a thermal conductivity of silicon. In at least one embodiment, the molding material layer 180 may have a thermal conductivity greater than about 2.8 W/m·K. This may allow the semiconductor device 100 to have a better thermal performance than the typical semiconductor device.

Figure 1B:
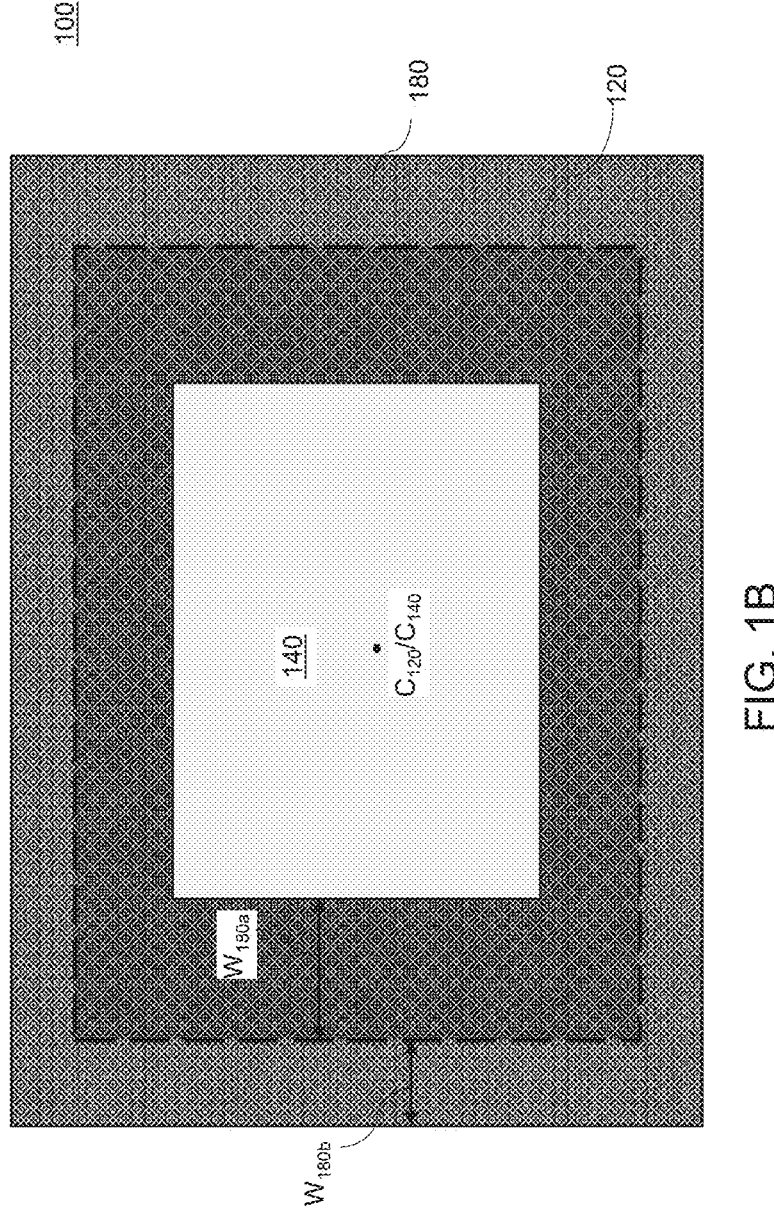
FIG. 1B is a plan view of the semiconductor device according to one or more embodiments.

Referring again to the drawings, FIG. 1B is a plan view of the semiconductor device 100 according to one or more embodiments. An outline of the bottom die 120 is shown in FIG. 1B by a dashed line to indicate that the bottom die 120 is underneath the molding material layer 180.

As illustrated in FIG. 1B, the bottom die 120 may be located in a central region of the semiconductor device 100. Further, the top die 140 may be located in a central region of the bottom die 120 so that the centerline $C_{120}$ of the bottom die 120 and the centerline $C_{140}$ of the top die 140 are substantially aligned. The molding material layer 180 may be formed around an entire periphery of the bottom die 120 and the top die 140. Further, a width $W_{180a}$ of the first lower face 180a of the molding material layer 180 (in the x-direction and/or y-direction) may be greater than the width $W_{180b}$ of the second lower face 180b of the molding material layer 180. Alternatively, the width W ma of the first lower face 180a of the molding material layer 180 (in the x-direction and/or y-direction) may be less than the width $W_{180b}$ of the second lower face 180b of the molding material layer 180. The width $W_{180a}$ of the first lower face 180a may be substantially uniform around the entire outer periphery of the top die 140 (between the sidewall of the top die 140 and the perimeter of the bottom die 120), and the width $W_{180b}$ of the second lower face 180b may be substantially uniform around the entire periphery of the bottom die 120.

Figure 2A:
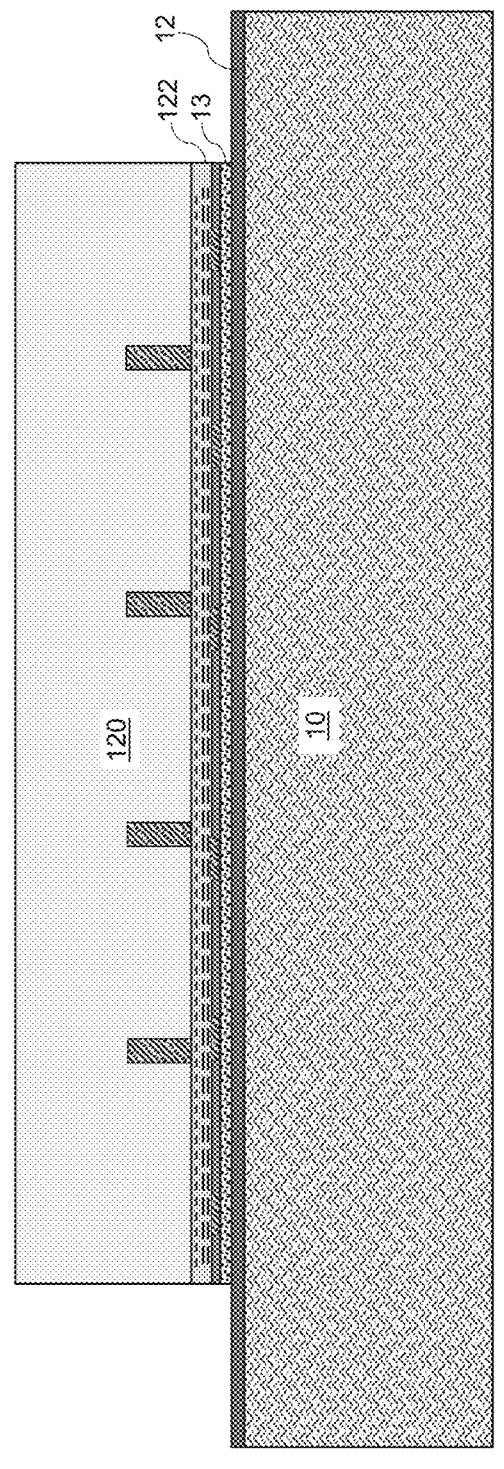
FIG. 2A is a vertical cross-sectional view of the bottom die bonded to a first carrier substrate, according to one or more embodiments.

FIGS. 2A-2I are vertical cross-sectional views of various intermediate structures in a method of forming the semiconductor device 100, according to one or more embodiments. In particular, FIG. 2A is a vertical cross-sectional view of the bottom die 120 bonded to a first carrier substrate 10, according to one or more embodiments.

As illustrated in FIG. 2A, the face side of the bottom die 120 (e.g., the side of the bottom die 120 including the bottom die active region 122) may be bonded or adhered to a first carrier substrate 10. The first carrier substrate 10 may include a circular wafer or a rectangular wafer. The lateral dimensions (such as the diameter of a circular wafer or a side of a rectangular wafer) of the first carrier substrate 10 may be in a range from 100 mm to 500 mm, such as from 200 mm to 400 mm, although lesser and greater lateral dimensions may also be used. The first carrier substrate 10 may include a semiconductor substrate, an insulating substrate, or a conductive substrate. The first carrier substrate 10 may be transparent or opaque. The thickness of the first carrier substrate 10 may be greater than a thickness of the top die 140, and sufficient to provide mechanical support to the semiconductor device 100. For example, the thickness of the first carrier substrate 10 may be in a range from 60 microns to 1 mm, although lesser and greater thicknesses may also be used.

In at least one embodiment, the first carrier substrate 10 may include a bonding dielectric layer 12 similar to the bonding dielectric layer 150. A bonding layer 13 similar to the bonding layer 170 may be formed on the bottom die active region 122. The bonding layer 13 may then be placed on the bonding dielectric layer 12 and heated so as to form a bond (e.g., oxide-oxide bond) between the bonding layer 13 and bonding dielectric layer 12.

Figure 2B:
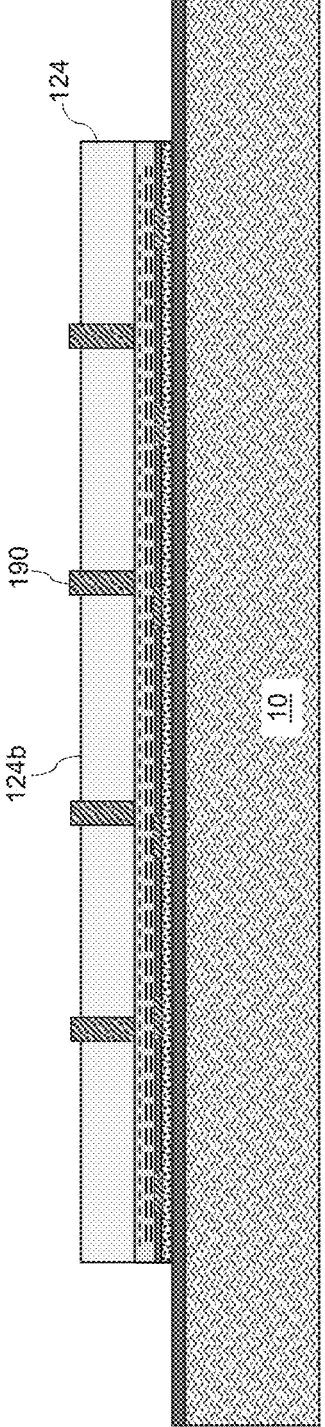
FIG. 2B is a vertical cross-sectional view of the bottom die on a thinned first carrier substrate, according to one or more embodiments.

FIG. 2B is a vertical cross-sectional view of the bottom die 120 on a thinned first carrier substrate 10, according to one or more embodiments. As illustrated in FIG. 2B, a thickness of the bottom die bulk semiconductor region 124 may be reduced so as to expose the upper portion of the TSVs 190. In particular, the bottom die bulk semiconductor region 124 may be thinned (e.g., reduced) by grinding (e.g., using a grinding wheel) until the TSVs 190 are exposed through the upper surface 124b of the bottom die bulk semiconductor region 124. A CMP step may then be optionally performed to polish the upper surface 124b of the bottom die bulk semiconductor region 124. An etching step (e.g., wet etching, dry etching) may then be performed so as to recess the bottom die bulk semiconductor region 124, and expose a length of the TSVs 190 that is substantially the same as a desired thickness of the subsequently formed bonding dielectric layer 150. The etching step may include a Si:Ox etching rate of 5:1.

Figure 2C:
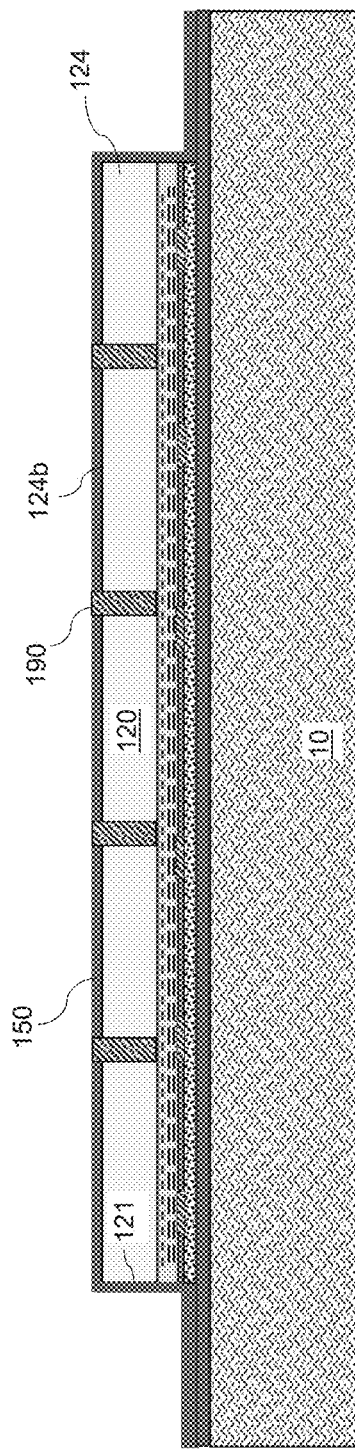
FIG. 2C is a vertical cross-sectional view of the bonding dielectric layer on the bottom die, according to one or more embodiments.

FIG. 2C is a vertical cross-sectional view of the bonding dielectric layer 150 on the bottom die 120, according to one or more embodiments. The bonding dielectric layer 150 may be formed so as to cover the bottom die 120. The bonding dielectric layer 150 may also be formed on the upper surface of the first carrier substrate 10. The bonding dielectric layer 150 may be formed so as to have a substantially uniform thickness on the upper surface 124b of the bottom die bulk semiconductor region 124, on the bottom die sidewall 121 and on the upper surface of the first carrier substrate 10. The bonding dielectric layer 150 may be formed on the bottom die 120 by deposition. In particular, the bonding dielectric layer 150 may be deposited by chemical vapor deposition (CVD), plasma enhanced chemical vapor deposition (PECVD), physical vapor deposition (PVD), spin coating, lamination or other suitable deposition technique.

The portion of the bonding dielectric layer 150 on the upper surface 124b of the bottom die bulk semiconductor region 124 may then be thinned so as to expose the upper surface of the TSVs 190. The bonding dielectric layer 150 may be thinned, for example, by CMP. After the thinning of the bonding dielectric layer 150, a thickness of the bonding dielectric layer 150 on the upper surface 124b of the bottom die bulk semiconductor region 124 may be substantially the same as a length of the protruding portion of the TSVs 190 that protrudes from the upper surface 124b. Thus, the upper surface of the TSVs 190 may be substantially coplanar with the upper surface of the bonding dielectric layer 150. In addition, the thickness of the bonding dielectric layer 150 on the upper surface 124b may be less than a thickness of the bonding dielectric layer 150 on the bottom die sidewall 121 and on the upper surface of the first carrier substrate 10.

FIG. 2D is a vertical cross-sectional view of the top die 140 mounted on the bottom die 120, according to one or more embodiments. Prior to mounting the top die 140 on the bottom die 120, the top die 140 may be prepared by forming the bonding layer 170 on the top die passivation layer 145. The bonding layer 170 may be deposited by chemical vapor deposition (CVD), plasma enhanced chemical vapor deposition (PECVD), physical vapor deposition (PVD), spin coating, lamination or other suitable deposition technique. An etching process (e.g., wet etching, dry etching, etc.) may then be performed in order to form openings in the bonding layer 170 and expose a surface of the top die contact pads 143. The metallization 179a (e.g., barrier layer and seed layer) may then be deposited in the openings and onto the top die contact pads 143. The metallization 179a may be formed (e.g., conformally formed) so as to conform to a shape of the openings. The metallization 179a may be formed, for example, by chemical vapor deposition (CVD), plasma enhanced chemical vapor deposition (PECVD), physical vapor deposition (PVD), spin coating, lamination or other suitable deposition technique.

The metal layer 179b may then be formed in the openings on the metallization layer 179a. The metal layer 179b may be formed, for example, by electroplating, although other suitable methods (e.g., deposition) may be used. The metallization 179a and the metal layer 179b may then be polished (e.g., by CMP) so that the bottom surface of the metallization 179a and the bottom surface of the metal layer 179b may be substantially coplanar with the bottom surface of the bonding layer 170.

The top die 140 may then be placed on the bottom die 120 so that the top die bonding pads 179 are aligned with and contact the TSVs 190. In particular, a centerline $C_{140}$ of the top die 140 may be substantially aligned in the z-direction with a centerline $C_{120}$ of the bottom die 120. A direct bonding process (e.g., hybrid bonding or SoIC bonding) may then be performed so as to bond the top die to the bottom die 120 by a direct bond (hybrid bond or SoIC bond) that includes an oxide-oxide bond between the bonding layer 170 and the bonding dielectric layer 150 and a metal-metal bond between the top die bonding pads 179 and the TSVs 190.

Figure 2E:
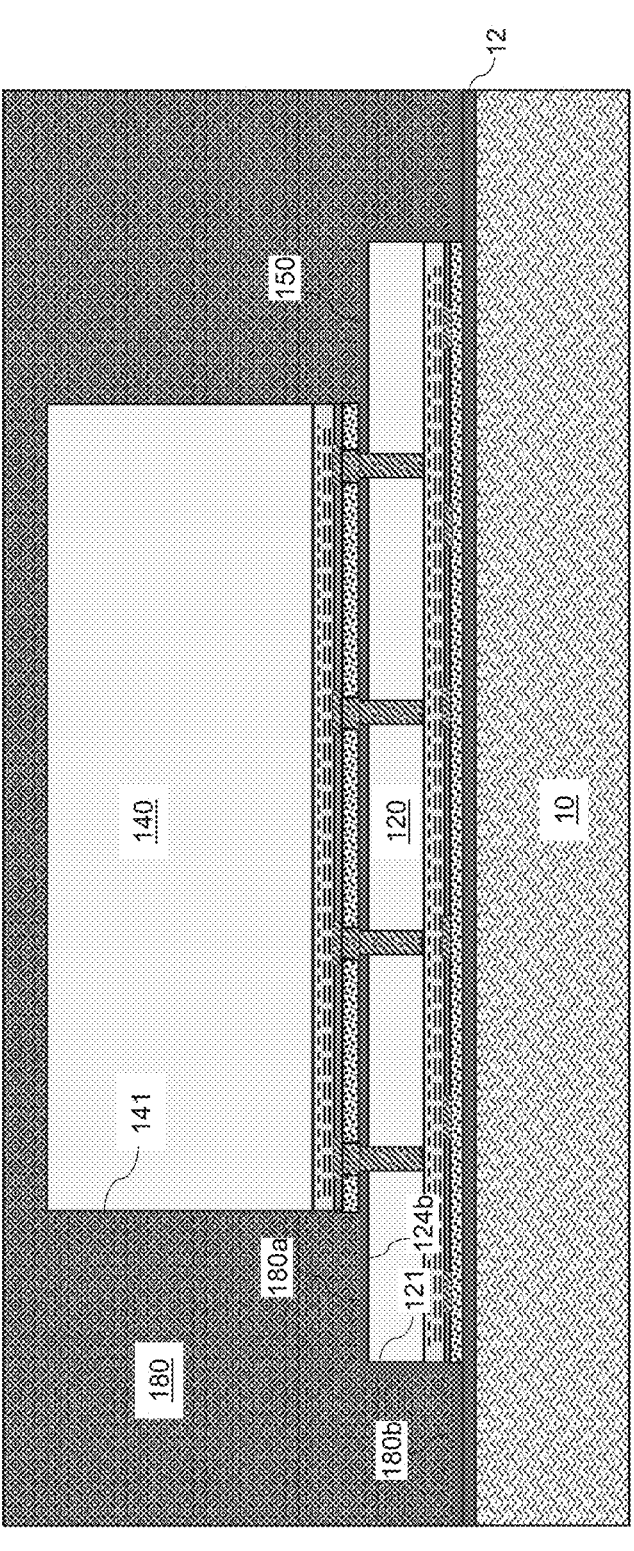
FIG. 2E is a vertical cross-sectional view of the molding material layer on the top die and the bottom die, according to one or more embodiments.

FIG. 2E is a vertical cross-sectional view of the molding material layer 180 on the top die 140 and the bottom die 120, according to one or more embodiments. The molding material layer 180 may be formed, for example, by a compression molding process. In the compression molding process, the first carrier substrate 10 with the bottom die 120 and top die 140 thereon may be placed in a compression mold. An epoxy mold compound (EMC) (e.g., thermally conductive EMC) may be placed in the center of the mold cavity. The EMC may be either a liquid molding material or solid particulate molding material. In order to provide release after molding, a release film may be placed over the top die 140.

After the first carrier substrate 10 and the EMC are loaded into the compression mold, the heated mold is closed compressing the EMC (liquid or the solid molding material). Upon heating, the EMC will liquify and will easily flow in the radial direction and encapsulate the bottom die 120 and top die 140. Once the material has flowed, a clamp pressure may be applied to the mold to allow for the EMC to cure. After the EMC has cured, the mold pressure may be released and the mold is opened. Once the mold opens, the release film may be peeled off of the intermediate structure in FIG. 2E. As illustrated in FIG. 2E, the molding material layer 180 may be formed so as to bond securely to the top die sidewall 141 and bottom die sidewall 121. In addition, the molding material layer 180 may be formed so that the first lower face 180a and second lower face 180b of the molding material layer 180 are bonded securely to the bonding dielectric layer 150.

Figure 2F:
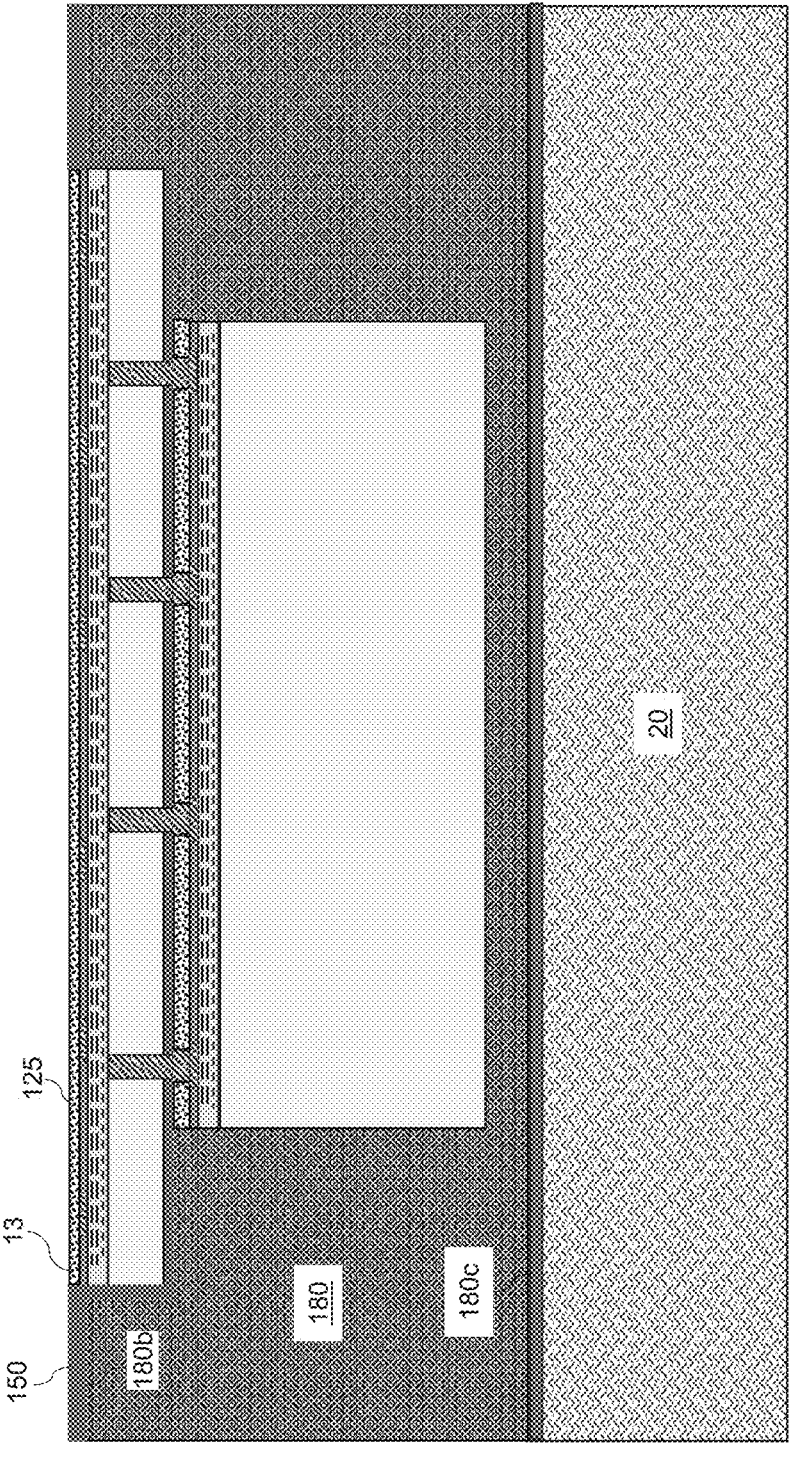
FIG. 2F is a vertical cross-sectional view of the intermediate structure (including the bottom die, top die and molding material layer) attached to a second carrier substrate, according to one or more embodiments.

FIG. 2F is a vertical cross-sectional view of the intermediate structure (including the bottom die 120, top die 140 and molding material layer 180) attached to a second carrier substrate 20, according to one or more embodiments. As illustrated in FIG. 2F, the intermediate structure may be inverted so that a face side of the bottom die 120 and a face side of the top die 140 are facing upward. The upper surface 180c of the molding material layer 180 may then be attached to a second carrier substrate 20.

The second carrier substrate 20 may include an optically transparent material such as glass or sapphire. An adhesive layer (not shown) may be applied to the top surface of the second carrier substrate 20. The upper surface 180c of the molding material layer 180 may then be pressed onto the adhesive layer and adhered to the second carrier substrate 20 by the adhesive. The adhesive layer may include a light-to-heat conversion (LTHC) layer or may include a thermally decomposing adhesive material. The LTHC layer may include a solvent-based coating applied using a spin coating method. The LTHC layer may form a layer that converts ultraviolet light to heat such that the LTHC layer loses adhesion. Alternatively, the adhesive layer (not shown) may include a thermally decomposing adhesive material. For example, the adhesive layer may include an acrylic pressure-sensitive adhesive that decomposes at an elevated temperature. The debonding temperature of the thermally decomposing adhesive material may be in a range from 150° C. to 400° C. Other suitable thermally decomposing adhesive materials that decompose at other temperatures are within the contemplated scope of disclosure.

After the intermediate structure is adhered to the second carrier substrate 20, the first carrier substrate 10 and bonding film 12 (see FIG. 2E) may be debonded (e.g., detached, removed, etc.) from the intermediate structure. The first carrier substrate 10 and bonding film 12 may be removed, for example, by a process of grinding, CMP and dry etching. Alternatively, the first carrier substrate 10 and bonding film 12 may be removed by a peeling process, a chemical process, photodecomposition process, thermomechanical process, or thermodecomposition process. In the peeling process, the bonded surface of the first carrier substrate 10 may be separated from the intermediate structure beginning at an outermost edge of the periphery of the first carrier substrate 10 and continuing transversely along the surface of the first carrier substrate 10 to the opposite edge of the first carrier substrate 10.

As illustrated in FIG. 2F, after removal of the first carrier substrate 10 and bonding film 12 (e.g., by grinding and CMP), a surface of the bonding layer 13 may be substantially coplanar with a surface of the bonding dielectric layer 150. However, in at least one embodiment, due to a different polishing rate between the bonding layer 13 and bonding dielectric layer 150, the bonding layer 13 may be slightly recessed. In such embodiments, the surface of the bonding layer 13 may be slightly lower than the surface of the bonding dielectric layer 150.

Figure 2G:
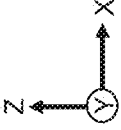
FIG. 2G is a vertical cross-sectional view of the intermediate structure including C4 bumps according to one or more embodiments.

FIG. 2G is a vertical cross-sectional view of the intermediate structure including C4 bumps 139 according to one or more embodiments. As illustrated in FIG. 2G, the protective layer 130 may be formed on the bonding layer 13 that remains on the bottom die passivation layer 125 of the bottom die 120. The protective layer 130 may also be formed on the portion of the bonding dielectric layer 150 that contacts the second lower face 180*b* of the molding material layer 180 and extends laterally (e.g., in the x-direction and/or y-direction) away from the bottom die 120. As illustrated in FIG. 2G, a thickness of a portion of the protective layer 130 contacting the bonding layer 13 may be substantially the same as (or slightly greater than) a thickness of the portion of the protective layer 130 contacting the bonding dielectric layer 150 (e.g., on the second lower face 180*b* of the molding material layer 180). The protective layer 130 may be formed, for example, by chemical vapor deposition (CVD), plasma enhanced chemical vapor deposition (PECVD), physical vapor deposition (PVD), spin coating, lamination or other suitable deposition technique.

An etching (e.g., wet etching, dry etching, etc.) may then be performed in order to form openings in the protective layer 130 and bonding layer 13. The openings may be formed so as to expose a surface of the bottom die contact pads 123. The C4 bumps 139 may then be formed on the bottom die contact pads 123 through the openings in the protective layer 130 and bonding layer 13. A diffusion barrier layer (not shown) and a seed layer (not shown) may be formed on the bottom die contact pads 123. The copper pillars 139*a* may then be formed on the bottom die contact pads 123. The copper pillars 139*a* may be formed, for example, by an ECP process.

The solder layer 139*b* (e.g., a solder ball) may then be formed on the copper pillar 139*a*. The solder layer 139*b* may include a solder material may have a melting point in a range from 90° C. to 450° C., and more particularly, in a range from about 220° C. to 260° C. The solder layer 139*b* may be formed, for example, by an electroplating process.

Figure 2H:
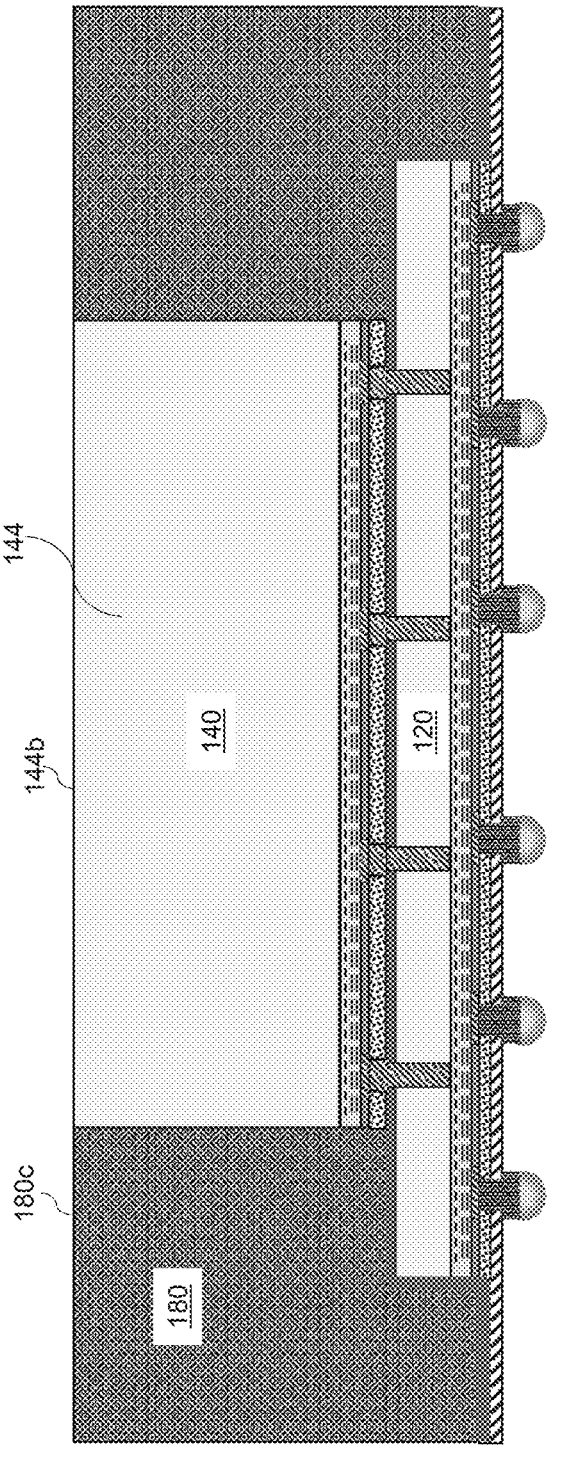
FIG. 2H is a vertical cross-sectional view of the intermediate structure including a thinned molding material layer according to one or more embodiments.

FIG. 2H is a vertical cross-sectional view of the intermediate structure including a thinned molding material layer 180 according to one or more embodiments. As illustrated in FIG. 2H, the second carrier substrate 20 may be removed, for example, by decomposing (e.g., by using heat, ultraviolet (UV) light, etc.) the adhesive layer that adheres the intermediate structure to the second carrier substrate 20.

The molding material layer 180 may then be thinned so that the upper surface 180*c* of the molding material layer 180 is substantially coplanar with an upper surface 144*b* of the top die bulk semiconductor region 144. The molding material layer 180 may be thinned, for example, by grinding the molding material layer 180, for example, using a grinding wheel.

FIG. 2I is a vertical cross-sectional view of the intermediate structure after singulation according to one or more embodiments. A singulation process may be used to separate the semiconductor device 100 from surrounding material (e.g., molding material). For example, a dicing saw may be used to separate the semiconductor device 100. The singulation process may be performed to form the protective layer extending portion 130*a* that extends laterally (e.g., in the x-direction and/or y-direction). In particular, singulation may be performed so that the protective layer extending portion 130*a* extends laterally by a distance that is at least 5% of the width of the bottom die 120 in a direction of the distance.

FIG. 3 is a flow chart illustrating a method of forming a semiconductor device 100, according to one or more embodiments. The method includes Step 310 of mounting a bottom semiconductor die including a bottom semiconductor die sidewall on a carrier substrate, Step 320 of mounting a top semiconductor die including a top semiconductor die sidewall on the bottom semiconductor die, and Step 330 of forming a molding material layer on an upper surface of the bottom semiconductor die, on the top semiconductor die sidewall, and on the bottom semiconductor die sidewall.

Figure 4:
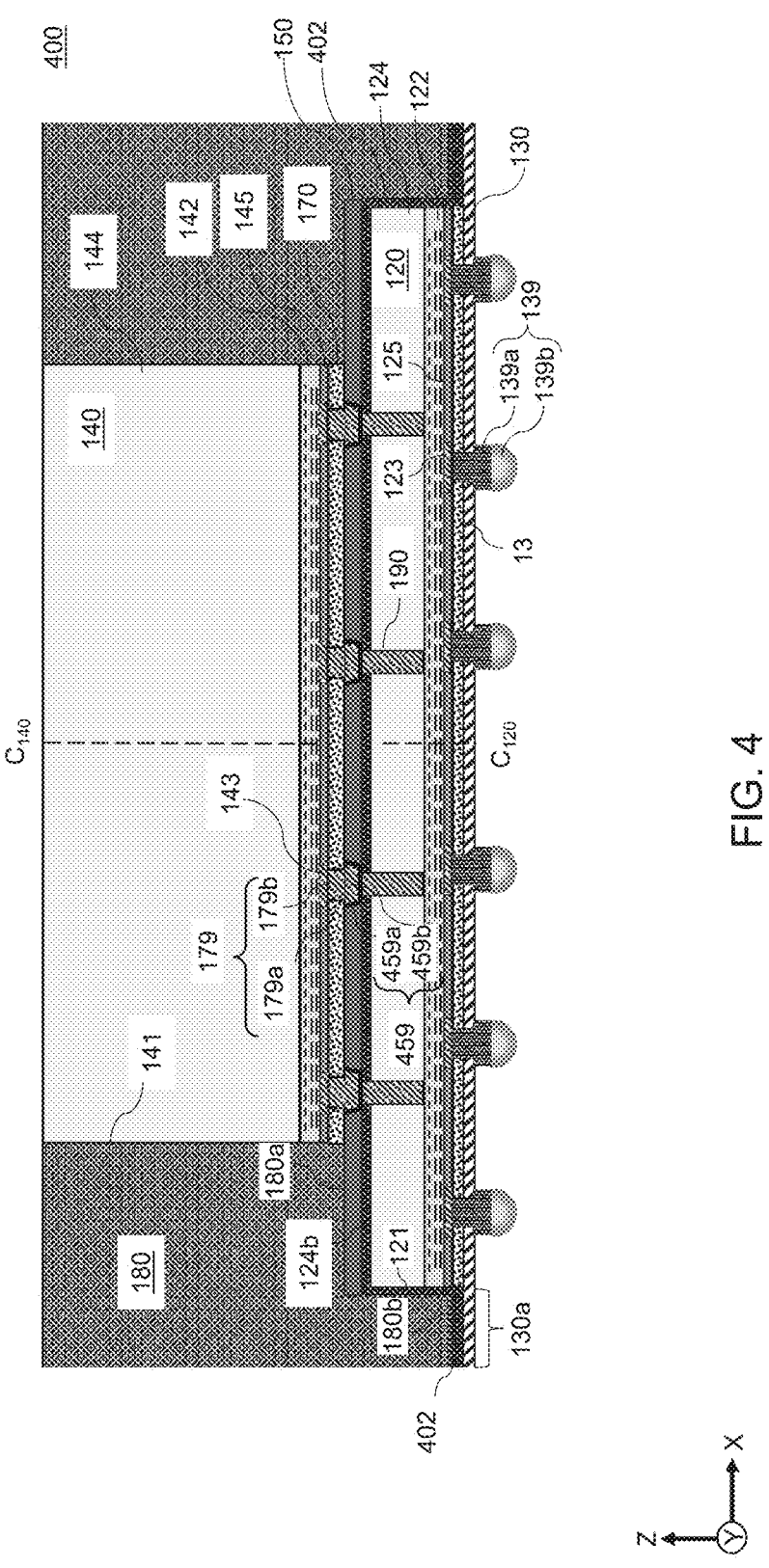
FIG. 4 is a vertical cross-sectional view of a semiconductor device according to one or more embodiments.

FIG. 4 is a vertical cross-sectional view of a semiconductor device 400 according to one or more embodiments. As illustrated in FIG. 4, the semiconductor device 400 may have a structure and function that is substantially similar to the structure and function of the semiconductor device 100 in FIGS. 1A and 1B. Therefore, unless otherwise noted, the discussion above regarding the structure and function of semiconductor device 100 may also apply to the semiconductor device 400.

In particular, the semiconductor device 400 may include the bottom die 120, the top die 140 mounted on the bottom die 120, and the molding material layer 180 on the bottom die 120 and the top die 140. The bottom die 120 may include the bottom die active region 122 and the bottom die bulk semiconductor region 124 on the bottom die active region 122. The bottom die bulk semiconductor region 124 may include one or more through silicon vias (TSVs) 190 that extend through the bottom die bulk semiconductor region 124 and protrude from the upper surface 124*b* of the bottom die bulk semiconductor region 124.

The bottom die 120 may also include one or more bottom die contact pads 123 on the surface of the bottom die active region 122. The bottom die 120 may also include the bottom die passivation layer 125 on the surface of the bottom die active region 122 and at least partially covering the bottom die contact pads 123. The semiconductor device 400 may also include the protective layer 130 on the bottom die passivation layer 125 (e.g., through a bonding layer 13 used to bond the bottom die 120 to a carrier substrate in processing). The protective layer 130 may include the protective layer extending portion 130*a* that extends laterally from the bottom die 120.

The semiconductor device 400 may also include the C4 bumps 139 on the face side of the bottom die 120. The C4 bumps 139 may include the copper pillar 139*a* that contacts the bottom die contact pad 123 through the opening in the protective layer 130 and bonding layer 13, and the solder layer 139*b* (e.g., a solder ball) on the copper pillar 139*a*.

In contrast to the semiconductor device 100, the semiconductor device 400 may include a gap fill layer 402 on the upper surface 124*b* of the bottom die bulk semiconductor region 124, and on the bottom die sidewall 121. The TSVs 190 may protrude through the upper surface 124*b* and into the gap fill layer 402. An upper surface of the TSVs 190 may be substantially coplanar with an upper surface of the gap fill layer 402. The gap fill layer 402 may include a nitride layer such as silicon nitride. In at least one embodiment, the gap fill layer 402 may include silicon carbide (SiC) or silicon oxynitride (SiON).

As illustrated in FIG. 4, the bonding dielectric layer 150 may be formed on the gap fill layer 402 on the bottom die 120. In contrast to the semiconductor device 100, in the semiconductor device 400 the bonding dielectric layer 150 have terminal portions over the upper surface 124*b* of the bottom die bulk semiconductor region 124. In addition, bottom die bonding pads 459 may be located in the bonding dielectric layer 150 and contact the upper surface of the TSVs 190. The bottom die bonding pads 459 may have a structure that is substantially similar to the structure of the top die bonding pads 179. Thus, for example, bottom die bonding pads 459 may include a metallization layer 459*a* that is substantially similar to the metallization layer 179*a*. The metallization layer 459*a* may that contact the upper surface of the TSVs 190 through the openings in the bonding dielectric layer 150. The bottom die bonding pads 459 may also include a metal layer 459b that is substantially similar to the metal layer 179a. An upper surface of the bottom die bonding pads 459 (e.g., an upper surface of the metallization layer 459a and the metal layer 459b) may be substantially coplanar with the upper surface of the bonding dielectric layer 150.

The top die 140 may be mounted on the back side of the bottom die 120. The centerline C140 of the top die 140 may be substantially aligned in the z-direction with a centerline C120 of the bottom die 120. Similar to the bottom die 120, the top die 140 may include a top die active region 142 and a top die bulk semiconductor region 144 on the top die active region 142. As in the semiconductor device 100, in the semiconductor device 400 a width of the top die 140 may be less than a width of the bottom die 120 (e.g., less than 80% of the width of the bottom die 120). In addition, the thickness of the top die 140 may be at least twice a thickness of the bottom die 120 (e.g., a thickness of the top die bulk semiconductor region 144 may be at least twice the thickness of the bottom die bulk semiconductor region 124).

The top die 140 may also include the top die contact pads 143 on a surface of the top die active region 142. The top die 140 may also include a top die passivation layer 145 on the surface of the top die active region 142 and at least partially covering the top die contact pads 143. The semiconductor device 400 may also include the bonding layer 170 on the top die passivation layer 145. The bonding layer 170 may be bonded (by an oxide-oxide bond) to the bonding dielectric layer 150. The top die contact pads 143 may be exposed through openings in the bonding layer 170.

The semiconductor device 400 may also include the top die bonding pads 179 on the face side of the top die 140. The bonding pads 179 may include the metallization layer 179a (e.g., diffusion barrier layer and a seed layer) that contacts the top die contact pad 143 through an opening in the bonding layer 170, and a metal layer 179b on the metallization layer 179a. The top die bonding pads 179 may be bonded (e.g., metal-metal bonded) to the bottom die bonding pads 459. Thus, the top die 140 may be bonded to the bottom die 120 by a "hybrid" bond that includes the oxide-oxide bond between the bonding layer 170 and the bonding dielectric layer 150 and a metal-metal bond between the top die bonding pads 179 and the bottom die bonding pads 459.

As further illustrated in FIG. 4, the molding material layer 180 may contact the top die sidewall 141. The molding material layer 180 may include the first lower face 180a that contacts the upper surface of the bonding dielectric layer 150 over the bottom die 120. The molding material layer 180 may also be formed on a surface of the gap fill layer 402 that is on the bottom die sidewall 121. That is, the gap fill layer 402 may include a gap fill layer sidewall portion contacting the bottom semiconductor die sidewall 121, and the molding material layer 190 may be on the gap fill layer sidewall portion.

Further, in contrast to the semiconductor device 100 where the second lower face 180b may contact the bonding dielectric layer 150, in the semiconductor device 400, the second lower face 180b of the molding material layer 180 may contact the gap fill layer 402 over an upper surface of the protective layer extending portion 130a.

Optionally, the gap fill layer 402 may not be located on the upper surface of the protective layer extending portion 130a. In that case, the second lower face 180b of the molding material layer 180 may contact the upper surface of the protective layer extending portion 130a.

Figure 5C:
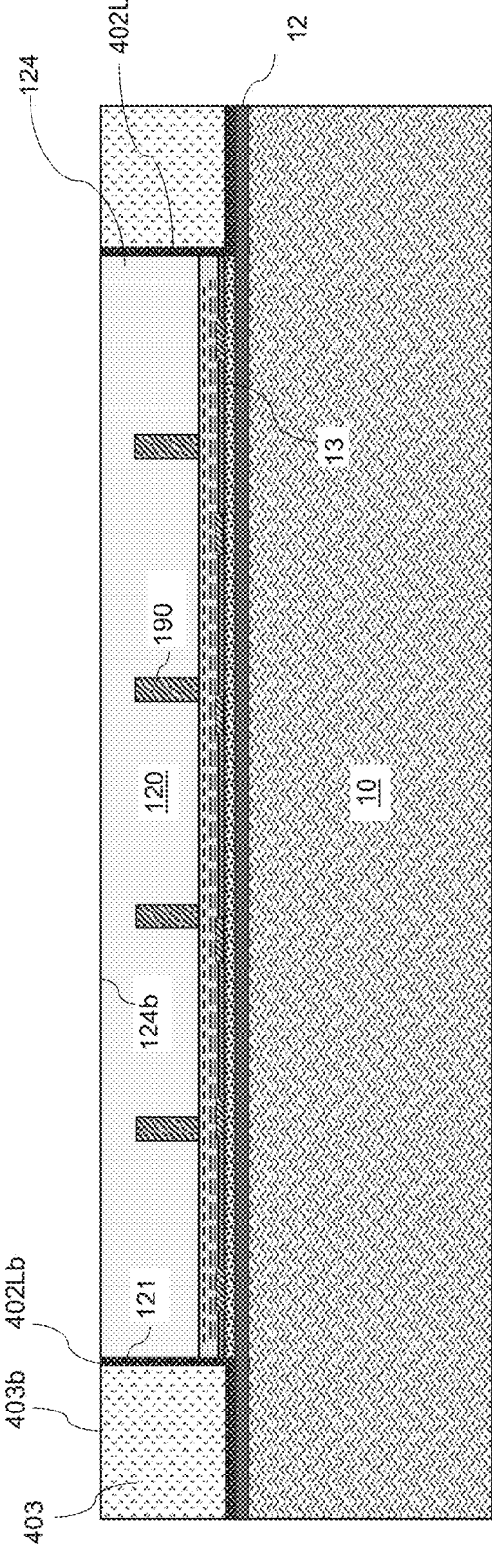
FIG. 5C is a vertical cross-sectional view of an intermediate structure including a reduced gap fill lower material/upper gap fill layer, according to one or more embodiments.

FIGS. 5A-5H are vertical cross-sectional views of various intermediate structures in a method of forming the semiconductor device 400, according to one or more embodiments. In particular, FIG. 5A is a vertical cross-sectional view of an intermediate structure including a bottom die 120 having a thinned bottom die bulk semiconductor region 124, according to one or more embodiments. Similar to the intermediate structure in FIG. 2A, in the intermediate structure of FIG. 5A, a bonding dielectric layer 12 on the first carrier substrate 10 may be bonded (e.g., by an oxide-oxide bond) to a bonding layer 13 on the bottom die active region 122.

Then, as illustrated in FIG. 5A, the bottom die bulk semiconductor region 124 may then be thinned (e.g., the thickness may be reduced). The thinning of the bottom die bulk semiconductor region 124 may not expose the upper portion of the TSVs 190. In particular, after thinning the bottom die bulk semiconductor region 124, a distance between the upper surface 124b of the bottom die bulk semiconductor region 124 and an upper surface of the TSVs 190 may be at least 10% of a thickness of the TSVs 190. The bottom die bulk semiconductor region 124 may be thinned (e.g., reduced) by grinding (e.g., using a grinding wheel). The grinding may be performed until it is determined that a desired amount of bottom die bulk semiconductor region 124 remains above the TSVs 190. After the grinding is performed, the upper surface 124b of the bottom die bulk semiconductor region 124 may be polished, such as by CMP.

FIG. 5B is a vertical cross-sectional view of an intermediate structure including a layer of gap fill lower material 402L formed on the bottom die 120 and the first carrier substrate 10, according to one or more embodiments. The gap fill lower material 402L (e.g., a nitride layer) may be conformally formed on the bottom semiconductor die 120 and on the first carrier substrate 10. The gap fill lower material 402L may be formed so as to cover the bottom die 120 and may also be formed on the upper surface of the first carrier substrate 10. The gap fill lower material 402L may also be formed on the bottom die sidewall 121 and on a sidewall of the bonding layer 13. The gap fill lower material 402L may be formed so as to have a substantially uniform thickness on the upper surface 124b of the bottom die bulk semiconductor region 124, on the bottom die sidewall 121, on the sidewall of the bonding layer 13, and on the upper surface of the first carrier substrate 10. The gap fill lower material 402L may be formed, for example, by deposition. In particular, the gap fill lower material 402L may be deposited by chemical vapor deposition (CVD), plasma enhanced chemical vapor deposition (PECVD), physical vapor deposition (PVD), spin coating, lamination or other suitable deposition technique.

An upper gap fill layer 403 may be formed on the gap fill lower material 402L over both the bottom semiconductor die 120 and the first carrier substrate 10. The upper gap fill layer 403 may include a dielectric material such as an oxide (e.g., silicon oxide). Other suitable dielectric materials may be used. The upper gap fill layer 403 may include an upper surface 403a that is formed over the first carrier substrate 10 and outside the bottom semiconductor die 120. The upper gap fill layer 403 may be formed so that a height (in the z-direction) of the upper surface 403a may be greater than a height of an upper surface 402La of the gap fill lower material 402L over the bottom semiconductor die 120. The upper gap fill layer 403 may be formed, for example, by deposition. In particular, the upper gap fill layer 403 may be deposited by chemical vapor deposition (CVD), plasma enhanced chemical vapor deposition (PECVD), physical vapor deposition (PVD), spin coating, lamination or other suitable deposition technique.

FIG. 5C is a vertical cross-sectional view of an intermediate structure including a reduced gap fill lower material 402L/upper gap fill layer 403, according to one or more embodiments. As illustrated in FIG. 5C, a thickness of the gap fill lower material 402L (e.g., nitride layer) and a thickness of the upper gap fill layer 403 (e.g., oxide layer) may be reduced so that an upper surface 402Lb of the gap fill lower material 402L and an upper surface 403b of the upper gap fill layer 403 are substantially coplanar with the upper surface 124b of the bottom die bulk semiconductor region 124. The thickness of the gap fill lower material 402L and the thickness of the upper gap fill layer 403 may be reduced, for example, in one or more etching steps by wet etching, dry etching, etc. After the one or more etching steps are performed, the upper surface 403b of the upper gap fill layer 403, the upper surface 402Lb of the gap fill lower material 402L, and the upper surface 124b of the bottom die bulk semiconductor region 124 may be substantially co-planar and polished in one or more polishing steps, such as by CMP.

FIG. 5D is a vertical cross-sectional view of an intermediate structure including the bonding dielectric layer 150, according to one or more embodiments.

First, an etching step (e.g., wet etching, dry etching) may be performed so as to the etch the upper surface 403b of the upper gap fill layer 403, the upper surface 402Lb of the gap fill lower material 402L, and the upper surface 124b of the bottom die bulk semiconductor region 124. The etching step may be performed so that an upper portion of the TSVs 190 protrude through the upper surface 124b of the bottom die bulk semiconductor region 124.

A gap fill upper material 402U may then be formed on the upper surface 403b of the upper gap fill layer 403, the upper surface 402Lb of the gap fill lower material 402L, and the upper surface 124b of the bottom die bulk semiconductor region 124. The gap fill upper material 402U may be formed so as to have a substantially uniform thickness. The gap fill upper material 402U may include the same material (e.g., a nitride material such as silicon nitride) as the gap fill lower material 402L. The gap fill upper material 402U may be formed, for example, by deposition. In particular, the gap fill upper material 402U may be deposited by chemical vapor deposition (CVD), plasma enhanced chemical vapor deposition (PECVD), physical vapor deposition (PVD), spin coating, lamination or other suitable deposition technique.

The bonding dielectric layer 150 may then be formed on the gap fill upper material 402U. The bonding dielectric layer 150 may be formed so as to have a substantially uniform thickness. In particular, the bonding dielectric layer 150 may be deposited by chemical vapor deposition (CVD), plasma enhanced chemical vapor deposition (PECVD), physical vapor deposition (PVD), spin coating, lamination or other suitable deposition technique.

Openings $O_{150}$ may then be formed in the bonding dielectric layer 150 in order to expose the upper surface of the TSVs 190. The openings $O_{150}$ may be formed, for example, by a photolithographic process including forming a patterned photoresist layer, and etching (e.g., wet etching, dry etching, etc.) the bonding dielectric layer 150 through the patterned photoresist layer. The etching may be performed, for example, in one or more etching steps. A width of the openings $O_{150}$ (e.g., in the x-direction) may be greater than a width of the TSVs 190, so that an upper surface of the gap fill upper material 402U may be exposed through the openings $O_{150}$. After the openings $O_{150}$ are formed, the upper surface of the TSVs 190 may remain substantially coplanar with the upper surface of the gap fill upper material 402U.

Figure 5E:
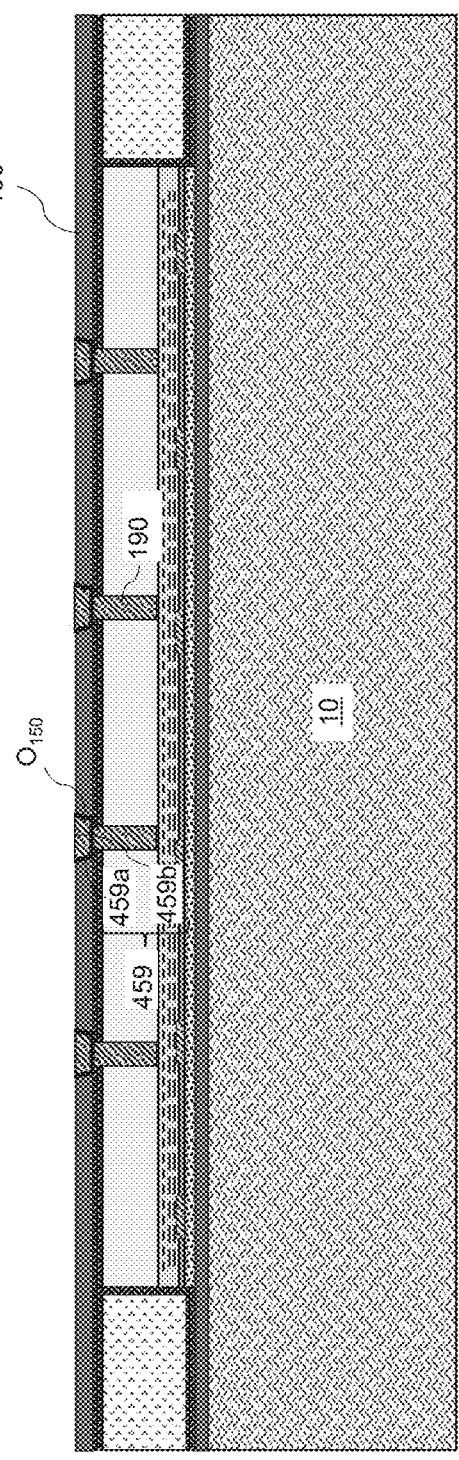
FIG. 5E is a vertical cross-sectional view of an intermediate structure including the bottom die bonding pads, according to one or more embodiments.

FIG. 5E is a vertical cross-sectional view of an intermediate structure including the bottom die bonding pads 459, according to one or more embodiments. As illustrated in FIG. 5E, the metallization 459a (e.g., barrier layer and seed layer) may be deposited in the openings $O_{150}$ and onto the upper surface of the TSVs 190. The metallization 459a may be formed (e.g., conformally formed) so as to conform to a shape of the openings $O_{150}$. The metallization 459a may be formed, for example, by chemical vapor deposition (CVD), plasma enhanced chemical vapor deposition (PECVD), physical vapor deposition (PVD), spin coating, lamination or other suitable deposition technique.

The metal layer 459b may then be formed in the openings $O_{150}$ on the metallization layer 459a. The metal layer 459b may be formed, for example, by electroplating, although other suitable methods (e.g., deposition) may be used. The metallization 459a and the metal layer 459b may then be polished (e.g., by CMP) so that the top surface of the metallization 459a and the top surface of the metal layer 459b may be substantially coplanar with the upper surface of the bonding layer 150.

Figure 5F:
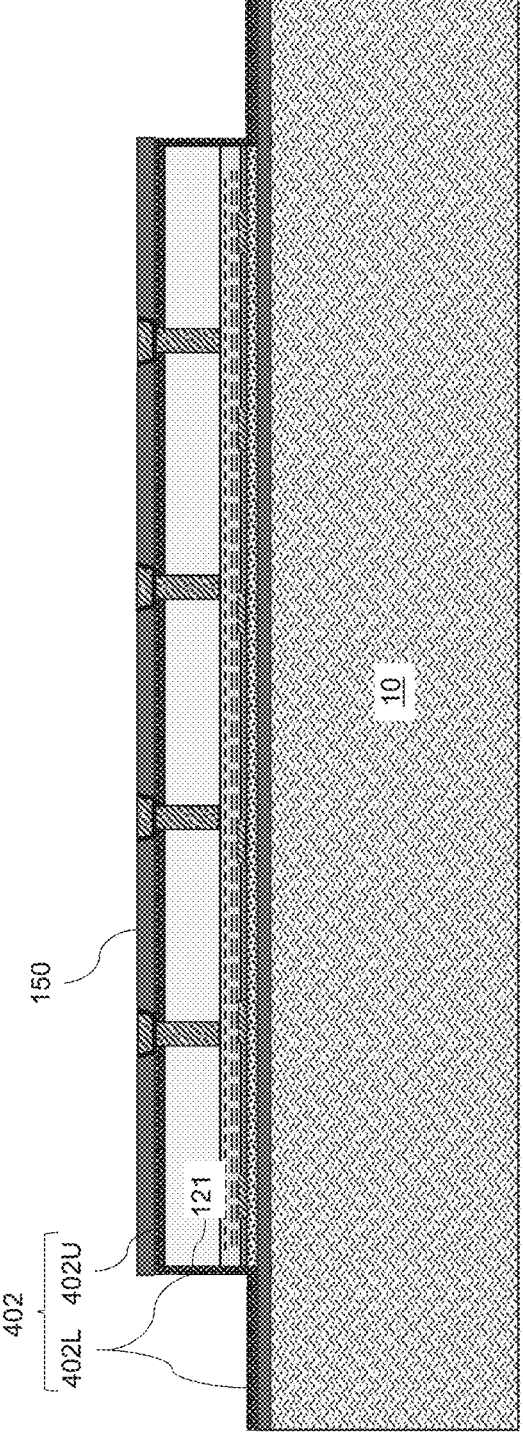
FIG. 5F is a vertical cross-sectional view of an intermediate structure including the gap fill layer, according to one or more embodiments.

FIG. 5F is a vertical cross-sectional view of an intermediate structure including the gap fill layer 402, according to one or more embodiments. As illustrated in FIG. 5F, an outer portion of the bonding dielectric layer 150 (e.g., oxide), an underlying outer portion of the gap fill upper material 402U (e.g., nitride), and the upper gap fill layer 403 (e.g., oxide), may then be removed. This may expose the gap fill lower material 402L on the first carrier substrate 10 and on the bottom die sidewall 121. This may also finalize the structure of the gap fill layer 402 that is constituted by the remaining portion of the gap fill upper material 402U and the remaining portion of the gap fill lower material 402L.

It should be noted that in this step, the gap fill lower material 402L on the first carrier substrate 10 may optionally be removed. In that case, the only portion of the gap fill lower material 402L remaining would be the portion formed on the bottom die sidewall 121.

This step may be accomplished, for example, by a photolithographic process in which a photoresist layer is formed on the bonding dielectric layer 150, and patterned to form an opening in the photoresist layer over the outer portion of the bonding dielectric layer 150 and expose the outer portion of the bonding dielectric layer 150. One or more etching processes (e.g., wet etching, dry etching, etc.) may then be performed to etch away the outer portion of the bonding dielectric layer 150, the underlying outer portion of the gap fill upper material 402U, and the upper gap fill layer 403. The photoresist layer may be subsequently removed by ashing, dissolving the photoresist layer or by consuming the photoresist layer during the etch process.

Figure 5G:
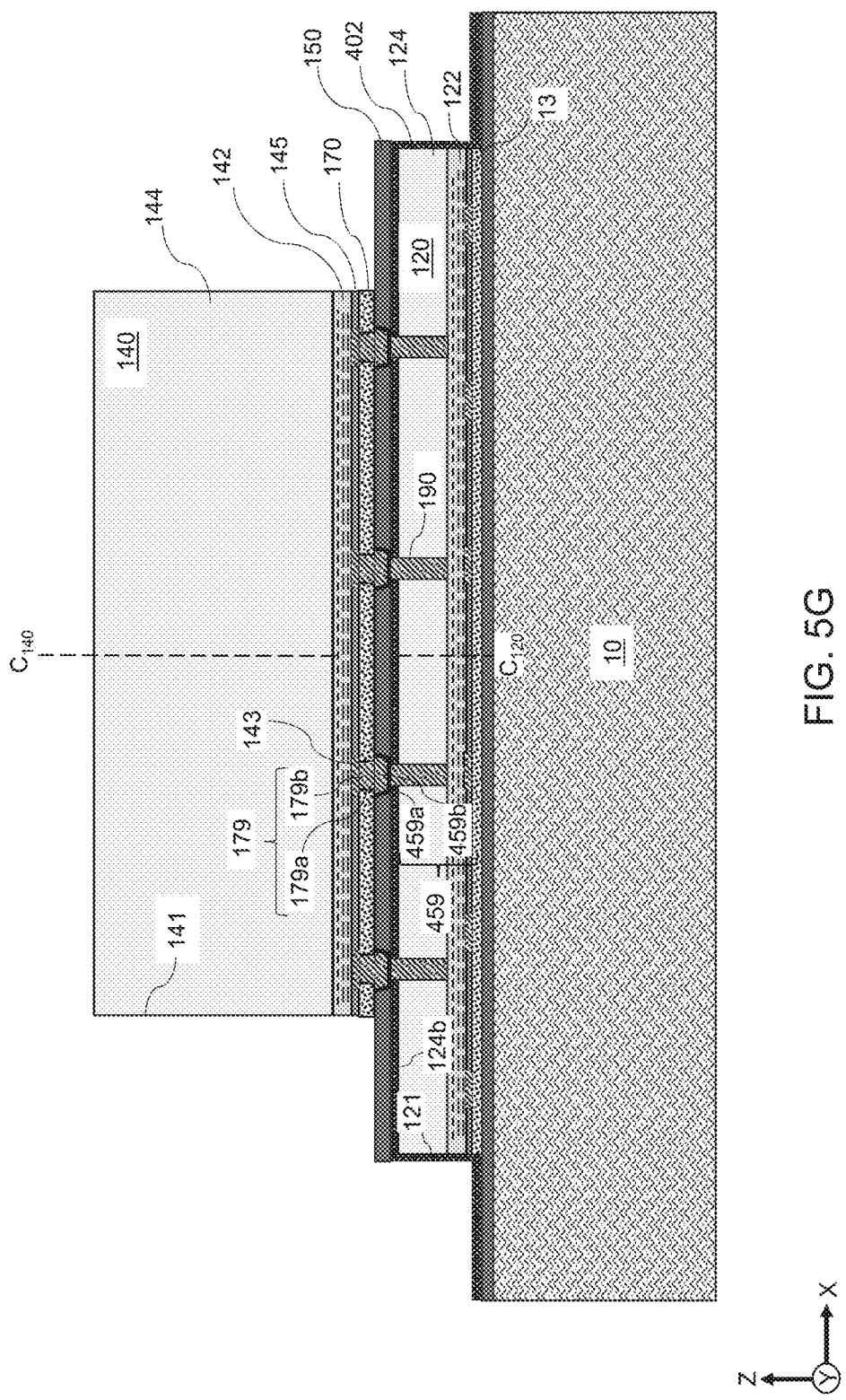
FIG. 5G is a vertical cross-sectional view of an intermediate structure including the top die mounted on the bottom die, according to one or more embodiments.

FIG. 5G is a vertical cross-sectional view of an intermediate structure including the top die 140 mounted on the bottom die 120, according to one or more embodiments. Prior to mounting the top die 140 on the bottom die 120, the top die 140 may be prepared in a manner similar to the manner described above for the semiconductor device 100 (e.g., see FIG. 2B). That is, the bonding layer 170 may be formed on the top die passivation layer 145 of the top die 140, and top die bonding pads 179 may be formed in openings in the bonding layer 170.

The top die 140 may then be placed on the bottom die 120 so that the top die bonding pads 179 are aligned with and contact the bottom die bonding pads 459. In particular, a centerline C140 of the top die 140 may be substantially aligned in the z-direction with a centerline C120 of the bottom die 120. A direct bonding process (e.g., hybrid bonding or SoIC bonding) may then be performed so as to bond the top die to the bottom die 120 by a direct bond (hybrid bond or SoIC bond) that includes an oxide-oxide bond between the bonding layer 170 and the bonding dielectric layer 150 and a metal-metal bond between the top die bonding pads 179 and the bottom die bonding pads 459.

Figure 5H:
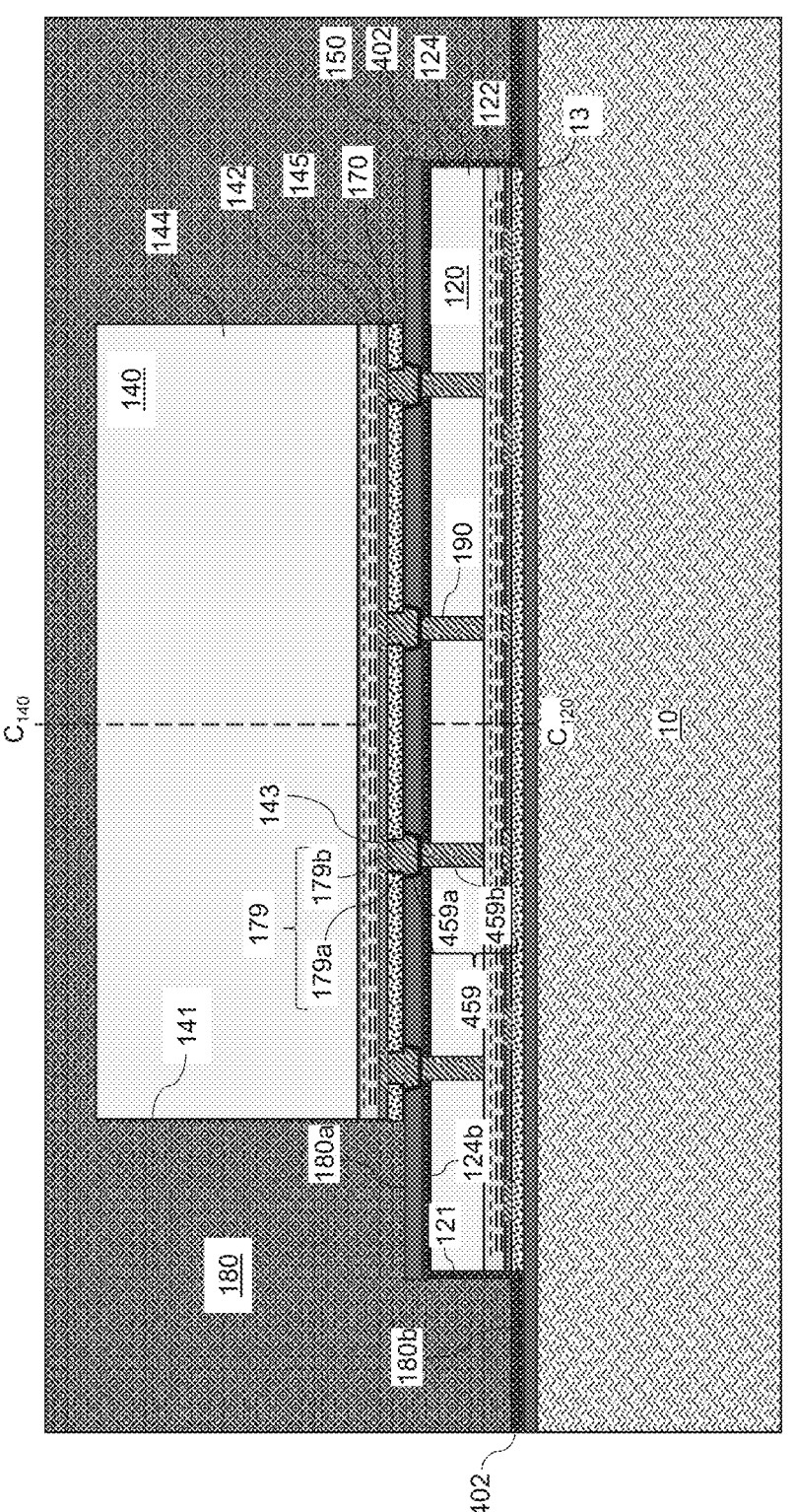
FIG. 5H is a vertical cross-sectional view of the molding material layer on the top die and the bottom die, according to one or more embodiments.

FIG. 5H is a vertical cross-sectional view of the molding material layer 180 on the top die 140 and the bottom die 120, according to one or more embodiments. The molding material layer 180 may be formed, for example, by a compression molding process similar to the compression molding process described above for semiconductor device 100. As illustrated in FIG. 5H, the molding material layer 180 may be formed so as to bond securely to the top die sidewall 141 and bottom die sidewall 121. In addition, the molding material layer 180 may be formed so that the first lower face 180a of the molding material layer 180 is bonded securely to the bonding dielectric layer 150, and the second lower face 180b of the molding material layer 180 is bonded securely to the gap fill layer 402.

Figure 5I:
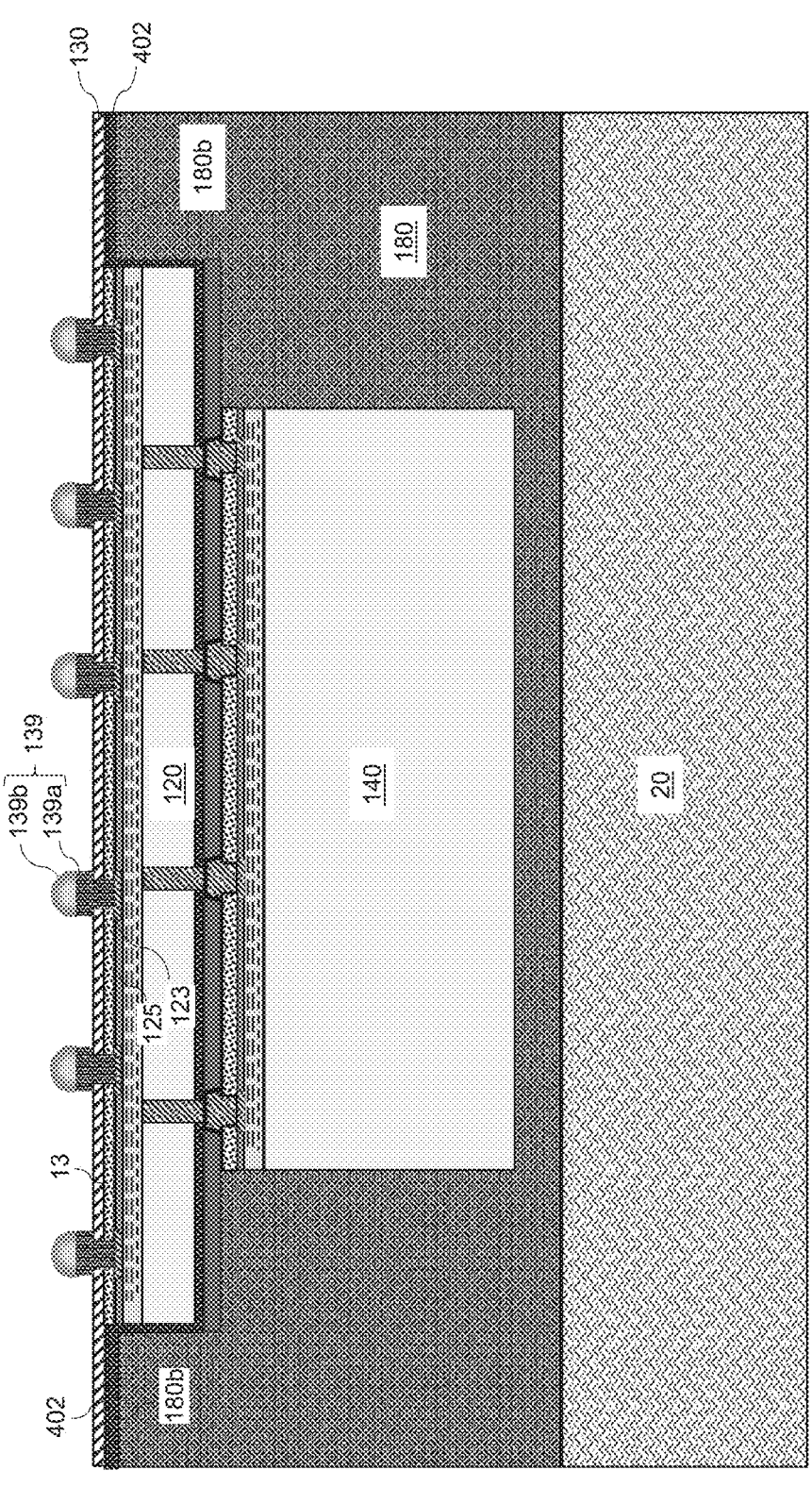
FIG. 5I is a vertical cross-sectional view of the intermediate structure including C4 bumps according to one or more embodiments.

FIG. 5I is a vertical cross-sectional view of the intermediate structure including C4 bumps 139 according to one or more embodiments. Prior to forming the C4 bumps 139, the intermediate structure may be attached to a second carrier substrate 20 and then detached from the first carrier substrate 10 (including removal of the bonding film 12) as described above with respect to semiconductor device 100.

As illustrated in FIG. 5I, after removal of the first carrier substrate 10 and bonding film 12 (e.g., by grinding and CMP), a surface of the bonding layer 13 may be substantially coplanar with a surface of the gap fill layer 402. However, in at least one embodiment, due to a different polishing rate between the bonding layer 13 and gap fill layer 402, the bonding layer 13 may be slightly recessed. In that case, the surface of the bonding layer 13 may be slightly lower than the surface of the gap fill layer 402.

As illustrated in FIG. 5I, the protective layer 130 may be formed on the bonding layer 13 that remains on the bottom die passivation layer 125 of the bottom die 120. The protective layer 130 may also be formed on the portion of the gap fill layer 402 that contacts the second lower face 180b of the molding material layer 180 and extends laterally (e.g., in the x-direction and/or y-direction) away from the bottom die 120. (Alternatively, if the portion of the gap fill layer 402 is not present, then the protective layer 130 may be formed on the second lower face 180b of the molding material layer 180.) As illustrated in FIG. 5I, a thickness of a portion of the protective layer 130 contacting the bonding layer 13 may be substantially the same as (or slightly greater than) a thickness of the portion of the protective layer 130 that contacts the gap fill layer 402 (e.g., on the second lower face 180b of the molding material layer 180). The C4 bumps 139 including copper pillars 139a and a solder layer 139b (e.g., solder balls) may then be formed on the bottom die contact pads 123 through openings in the protective layer 130 and bonding layer 13, as described above with respect to semiconductor device 100.

Figure 5J:
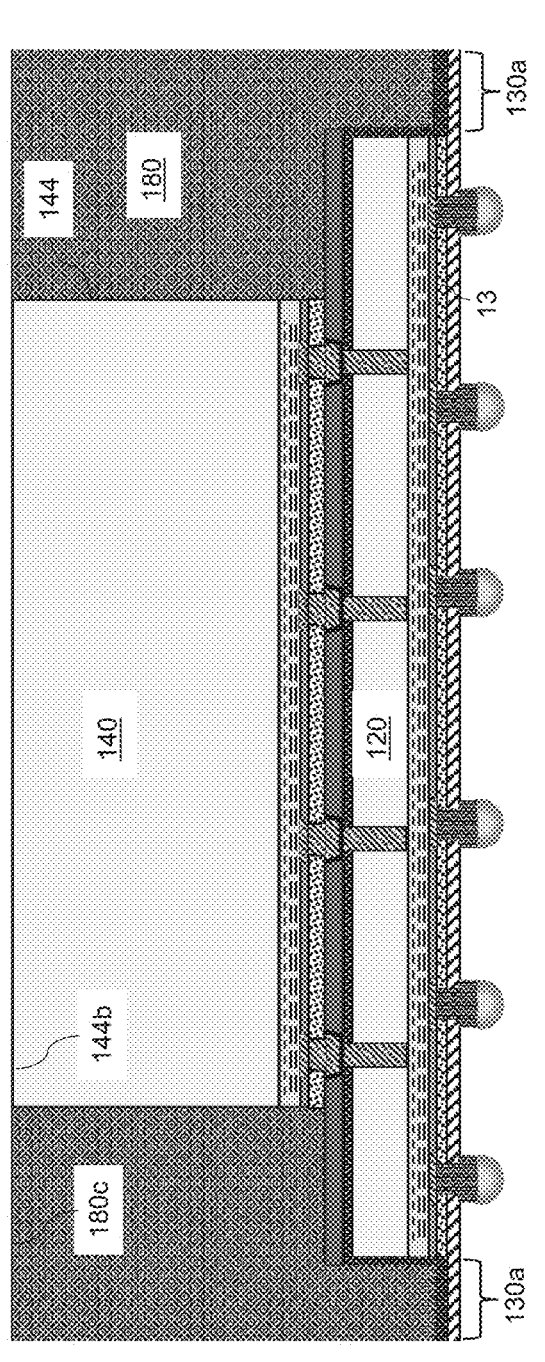
FIG. 5J is a vertical cross-sectional view of the intermediate structure after singulation and thinning the molding material layer according to one or more embodiments.

FIG. 5J is a vertical cross-sectional view of the intermediate structure after singulation and thinning the molding material layer 180 according to one or more embodiments. As illustrated in FIG. 5J, the second carrier substrate 20 may be removed, for example, by decomposing (e.g., by using heat, ultraviolet (UV) light, etc.) the adhesive layer that adheres the intermediate structure to the second carrier substrate 20. The molding material layer 180 may then be thinned so that the upper surface 180c of the molding material layer 180 is substantially coplanar with an upper surface 144b of the top die bulk semiconductor region 144. The molding material layer 180 may be thinned, for example, by grinding the molding material layer 180, for example, using a grinding wheel.

A singulation process may be used to separate the semiconductor device 400 from surrounding material (e.g., molding material). For example, a dicing saw may be used to separate the semiconductor device 400. The singulation process may be performed to form the protective layer extending portion 130a that extends laterally (e.g., in the x-direction and/or y-direction). In particular, singulation may be performed so that the protective layer extending portion 130a extends laterally by a distance that is at least 5% of the width of the bottom die 120 in a direction of the distance.

Figure 6:
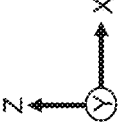
FIG. 6 is a vertical cross-sectional view of a semiconductor device according to one or more embodiments.

FIG. 6 is a vertical cross-sectional view of a semiconductor device 600 according to one or more embodiments. As illustrated in FIG. 6, the semiconductor device 400 may have a structure and function that is substantially similar to the structure and function of the semiconductor device 100 in FIGS. 1A and 1B. Therefore, unless otherwise noted, the discussion above regarding the structure and function of semiconductor device 100 may also apply to the semiconductor device 600.

In particular, the semiconductor device 600 may include the bottom die 120, the top die 140 mounted on the bottom die 120, and the molding material layer 180 on the bottom die 120 and the top die 140. The bottom die 120 may include the bottom die active region 122 and the bottom die bulk semiconductor region 124 on the bottom die active region 122. The bottom die bulk semiconductor region 124 may include one or more through silicon vias (TSVs) 190 that extend through the bottom die bulk semiconductor region 124 and protrude from the upper surface 124b of the bottom die bulk semiconductor region 124.

The bottom die 120 may also include one or more bottom die contact pads 123 on the surface of the bottom die active region 122. The bottom die 120 may also include the bottom die passivation layer 125 on the surface of the bottom die active region 122 and at least partially covering the bottom die contact pads 123. The semiconductor device 600 may also include the protective layer 130 on the bottom die passivation layer 125 (e.g., through a bonding layer 13 used to bond the bottom die 120 to a carrier substrate during processing). The protective layer 130 may include the protective layer extending portion 130a that extends laterally from the bottom die 120.

The semiconductor device 600 may also include the C4 bumps 139 on the face side of the bottom die 120. The C4 bumps 139 may include the copper pillar 139a that contacts the bottom die contact pad 123 through the opening in the protective layer 130 and bonding layer 13, and the solder layer 139b (e.g., a solder ball) on the copper pillar 139a.

In contrast to the semiconductor device 100, the semiconductor device 600 may include the gap fill layer 402 (e.g., similar to the semiconductor device 400) on the upper surface 124b of the bottom die bulk semiconductor region 124, and on the bottom die sidewall 121. The TSVs 190 may protrude through the upper surface 124b and into the gap fill layer 402. An upper surface of the TSVs 190 may be substantially coplanar with an upper surface of the gap fill layer 402. The gap fill layer 402 may include a nitride layer such as silicon nitride.

As further illustrated in FIG. 6, the bonding dielectric layer 150 may be formed on the gap fill layer 402 on the bottom die 120. The bonding dielectric layer 150 may also be formed on the portion of gap fill layer 402 on the bottom die sidewall 121. The bonding dielectric layer 150 may also be formed on the portion of the gap fill layer 402 over the protective layer extending portion 130*a*. In addition, bottom die bonding pads 459 (similar to semiconductor device 400) may be located in the bonding dielectric layer 150 and contact the upper surface of the TSVs 190. The bottom die bonding pads 459 may include the metallization layer 459*a* and the metal layer 459*b* on the metallization layer 459*a*. The upper surface of the bottom die bonding pads 459 may be substantially coplanar with the upper surface of the bonding dielectric layer 150.

In further contrast to the semiconductor device 100 (and in contrast to the semiconductor device 400), the semiconductor device 600 may optionally include a metal layer 605 located on the bonding dielectric layer 150. In particular, the metal layer 605 may be located on the bottom die sidewall 121 and on the protective layer extending portion 130*a*. The metal layer 605 may include the same material as the metal layer 459*b* in the bottom die bonding pads 459.

The top die 140 may be mounted on the back side of the bottom die 120. The centerline C140 of the top die 140 may be substantially aligned in the z-direction with a centerline C120 of the bottom die 120. Similar to the bottom die 120, the top die 140 may include a top die active region 142 and a top die bulk semiconductor region 144 on the top die active region 142. As in the semiconductor device 100, in the semiconductor device 600 a width of the top die 140 may be less than a width of the bottom die 120 (e.g., less than 80% of the width of the bottom die 120). In addition, the thickness of the top die 140 may be at least twice a thickness of the bottom die 120 (e.g., a thickness of the top die bulk semiconductor region 144 may be at least twice the thickness of the bottom die bulk semiconductor region 124).

The top die 140 may also include the top die contact pads 143 on a surface of the top die active region 142. The top die 140 may also include a top die passivation layer 145 on the surface of the top die active region 142 and at least partially covering the top die contact pads 143. The semiconductor device 400 may also include the bonding layer 170 on the top die passivation layer 145. The bonding layer 170 may be bonded (by an oxide-oxide bond) to the bonding dielectric layer 150. The top die contact pads 143 may be exposed through openings in the bonding layer 170.

The semiconductor device 400 may also include the top die bonding pads 179 on the face side of the top die 140. The bonding pads 179 may include the metallization layer 179*a* (e.g., diffusion barrier layer and a seed layer) that contacts the top die contact pad 143 through the opening in the bonding layer 170, and a metal layer 179*b* on the metallization layer 179*a*. The top die bonding pads 179 may be bonded (e.g., metal-metal bonded) to the bottom die bonding pads 459. Thus, the top die 140 may be bonded to the bottom die 120 by a "hybrid" bond that includes the oxide-oxide bond between the bonding layer 170 and the bonding dielectric layer 150 and a metal-metal bond between the top die bonding pads 179 and the bottom die bonding pads 459.

As further illustrated in FIG. 6, the molding material layer 180 may contact the top die sidewall 141. The molding material layer 180 may include the first lower face 180*a* that contacts the upper surface of the bonding dielectric layer 150 over the bottom die 120. The molding material layer 180 may also be formed on a surface of the metal layer 605 (or, optionally, the gap fill layer 402) that is on the bottom die sidewall 121. The second lower face 180*b* of the molding material layer 180 may contact a surface of the metal layer

605 (or, optionally, the gap fill layer 402) over the upper surface of the protective layer extending portion 130*a*.

Figure 7A:
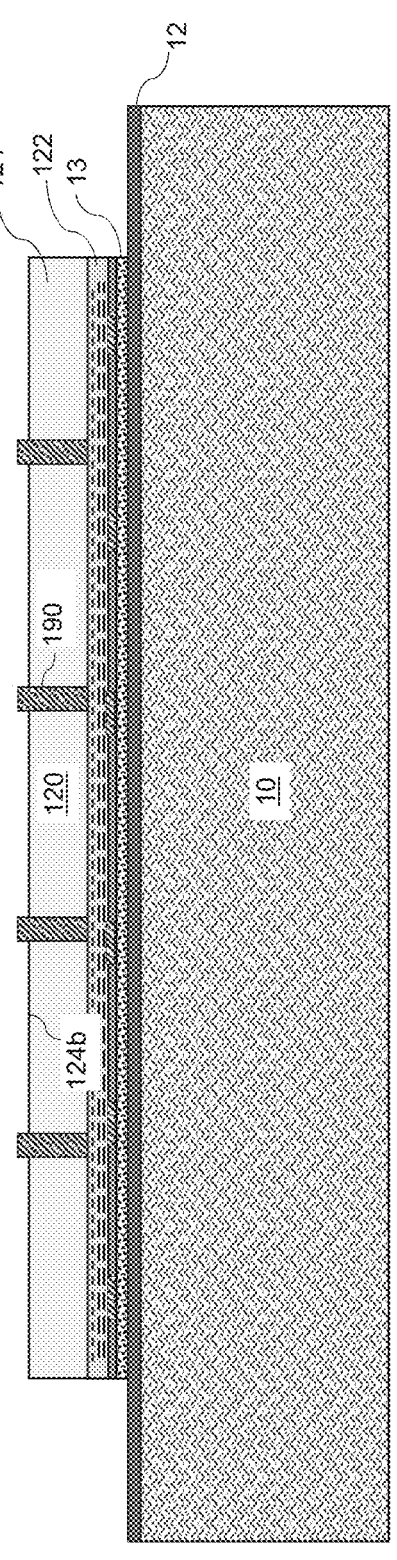
FIG. 7A is a vertical cross-sectional view of an intermediate structure including a bottom die having a thinned bottom die bulk semiconductor region, according to one or more embodiments.

FIGS. 7A-7H are vertical cross-sectional views of various intermediate structures in a method of forming the semiconductor device 600, according to one or more embodiments. In particular, FIG. 7A is a vertical cross-sectional view of an intermediate structure including a bottom die 120 having a thinned bottom die bulk semiconductor region 124, according to one or more embodiments. Similar to the intermediate structure in FIG. 2A, in the intermediate structure of FIG. 7A, a bonding dielectric layer 12 on the first carrier substrate 10 may be bonded (e.g., by an oxide-oxide bond) to a bonding layer 13 on the bottom die active region 122.

Then, as illustrated in FIG. 7A, the bottom die bulk semiconductor region 124 may then be thinned (e.g., the thickness may be reduced) so as to expose the upper portion of the TSVs 190. In particular, the bottom die bulk semiconductor region 124 may be thinned (e.g., reduced) by grinding (e.g., using a grinding wheel) until the TSVs 190 are exposed through the upper surface 124*b* of the bottom die bulk semiconductor region 124. A CMP step may then be optionally performed to polish the upper surface 124*b* of the bottom die bulk semiconductor region 124.

An etching step (e.g., wet etching, dry etching) may then be performed so as to recess the bottom die bulk semiconductor region 124, and expose a length of the TSVs 190 that is substantially the same as a desired thickness of the subsequently formed gap fill layer 402. The etching step may include a Si:Ox etching rate of 5:1.

Figure 7B:
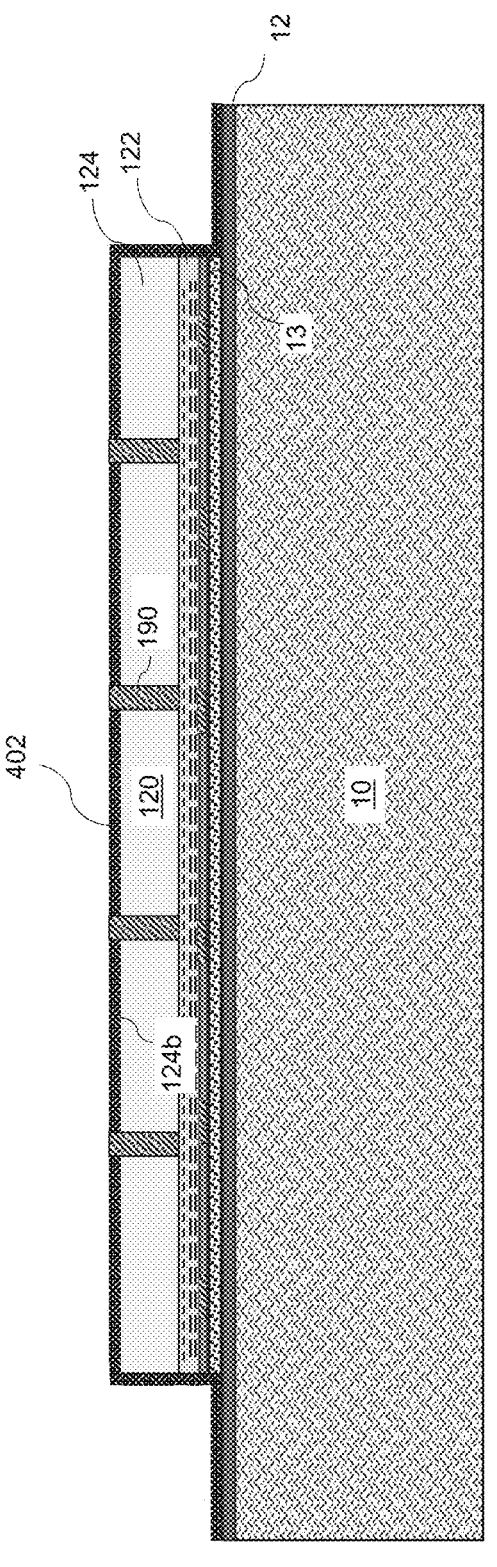
FIG. 7B is a vertical cross-sectional view of an intermediate structure including the gap fill layer formed on the bottom die and the first carrier substrate, according to one or more embodiments.

FIG. 7B is a vertical cross-sectional view of an intermediate structure including the gap fill layer 402 formed on the bottom die 120 and the first carrier substrate 10, according to one or more embodiments. The gap fill layer 402 (e.g., a nitride layer) may be conformally formed on the bottom semiconductor die 120 and on the first carrier substrate 10. The gap fill layer 402 may be formed so as to cover the bottom die 120 and may also be formed on the upper surface of the first carrier substrate 10. The gap fill layer 402 may also be formed on the bottom die sidewall 121 and on a sidewall of the bonding layer 13. The gap fill layer 402 may be formed so as to have a substantially uniform thickness on the upper surface 124*b* of the bottom die bulk semiconductor region 124, on the bottom die sidewall 121, on the sidewall of the bonding layer 13, and on the upper surface of the first carrier substrate 10. The gap fill layer 402 may be deposited by chemical vapor deposition (CVD), plasma enhanced chemical vapor deposition (PECVD), physical vapor deposition (PVD), spin coating, lamination or other suitable deposition technique.

The gap fill layer 402 may then be polished (e.g., by CMP) in order to reveal the upper surface of the TSVs 190. Thus, the upper surface of the gap fill layer 402 may be substantially coplanar with the upper surface of the TSVs 190.

Figure 7C:
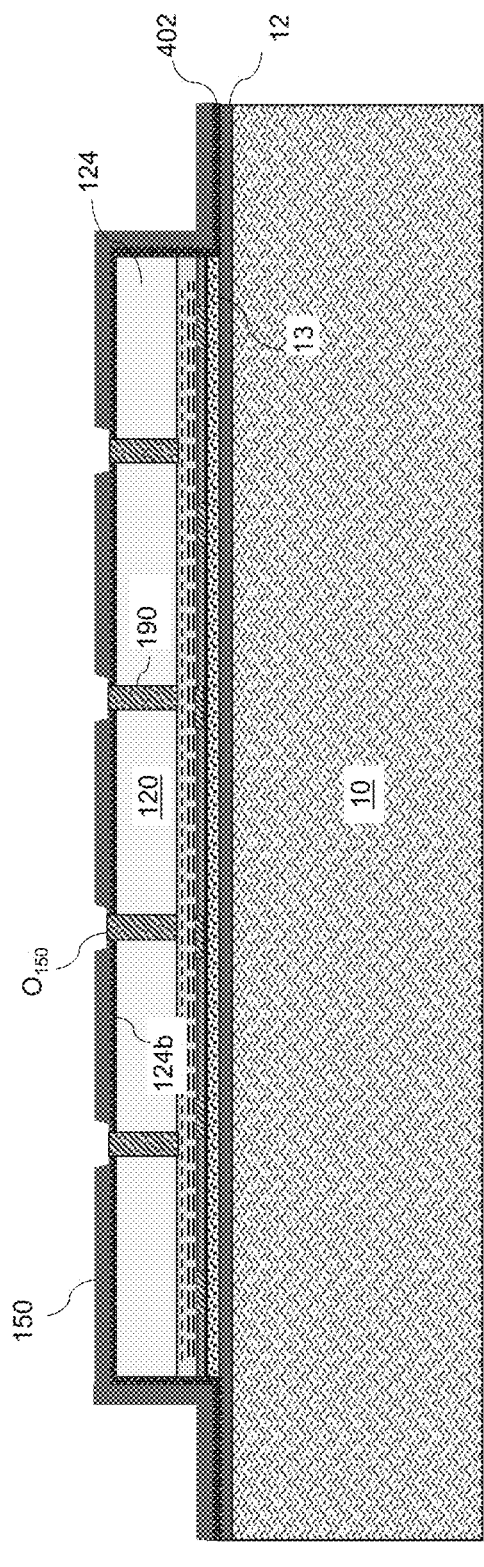
FIG. 7C is a vertical cross-sectional view of an intermediate structure including the bonding dielectric layer, according to one or more embodiments.

FIG. 7C is a vertical cross-sectional view of an intermediate structure including the bonding dielectric layer 150, according to one or more embodiments. The bonding dielectric layer 150 may be formed on the gap fill layer 402 over the bottom die 102 and outside the bottom die 102 over the first carrier substrate 10. The bonding dielectric layer 150 may be formed so as to have a substantially uniform thickness. In particular, the bonding dielectric layer 150 may be deposited by chemical vapor deposition (CVD), plasma enhanced chemical vapor deposition (PECVD), physical vapor deposition (PVD), spin coating, lamination or other suitable deposition technique.

Openings $O_{150}$ may then be formed in the bonding dielectric layer 150 in order to expose the upper surface of the TSVs 190. The openings $O_{150}$ may be formed, for example, by a photolithographic process including forming a patterned photoresist layer, and etching (e.g., wet etching, dry etching, etc.) the bonding dielectric layer 150 through the patterned photoresist layer. The etching may be performed, for example, in one or more etching steps. A width of the openings $O_{150}$ (e.g., in the x-direction) may be greater than a width of the TSVs 190, so that an upper surface of the gap fill layer 402 may be exposed through the openings $O_{150}$. After the openings $O_{150}$ are formed, the upper surface of the TSVs 190 may remain substantially coplanar with the upper surface of the gap fill layer 402.

Figure 7D:
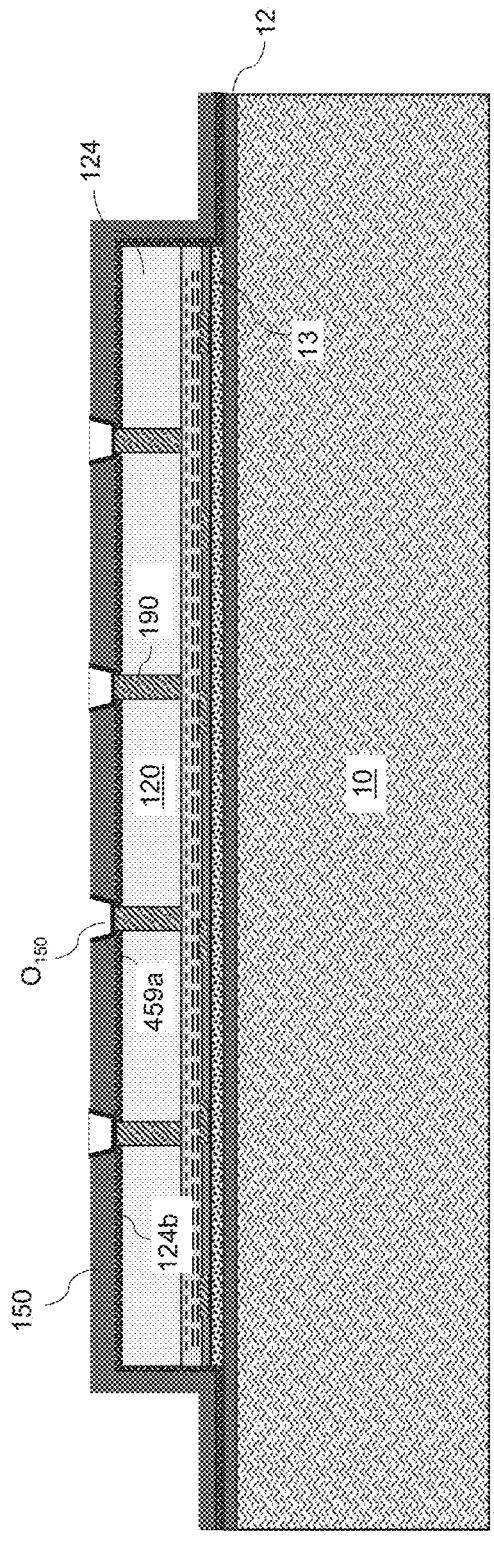
FIG. 7D is a vertical cross-sectional view of an intermediate structure including the metallization of the bottom die bonding pads, according to one or more embodiments.

FIG. 7D is a vertical cross-sectional view of an intermediate structure including the metallization 459a of the bottom die bonding pads 459, according to one or more embodiments. As illustrated in FIG. 7D, the metallization 459a (e.g., barrier layer and seed layer) may be deposited in the openings $O_{150}$ and onto the upper surface of the TSVs 190. The metallization 459a may be formed (e.g., conformally formed) so as to conform to a shape of the openings $O_{150}$.

Figure 7E:
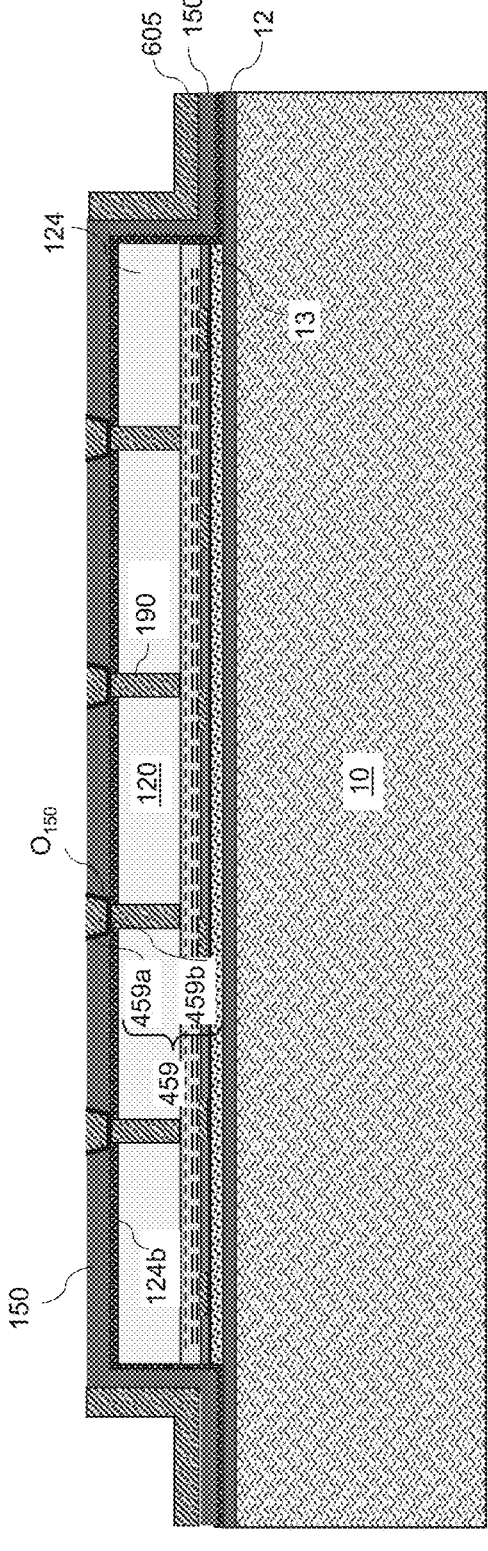
FIG. 7E is a vertical cross-sectional view of an intermediate structure including the metal layer of the bottom die bonding pads, according to one or more embodiments.

FIG. 7E is a vertical cross-sectional view of an intermediate structure including the metal layer 459b of the bottom die bonding pads 459, according to one or more embodiments. The metal layer 459b may then be formed in the openings $O_{150}$ on the metallization layer 459a. The metal layer 459b may be formed, for example, by forming the metal layer 605 (e.g., a copper layer) by electrochemical plating (ECP) (although other suitable methods (e.g., deposition) may be used). The metallization 459a and the metal layer 459b may then be polished (e.g., by CMP) to remove the metal layer 605 from the upper surface of the bonding dielectric layer 150 over the bottom die 120. After the CMP, the top surface of the metallization 459a and the top surface of the metal layer 459b may be substantially coplanar with the upper surface of the bonding layer 150. However, as illustrated in FIG. 7E, the metal layer 605 may remain off of the bottom die 120 and over the first carrier substrate 10.

Figure 7F:
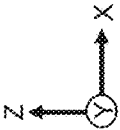
FIG. 7F is a vertical cross-sectional view of an intermediate structure including the top die mounted on the bottom die, according to one or more embodiments.

FIG. 7F is a vertical cross-sectional view of an intermediate structure including the top die 140 mounted on the bottom die 120, according to one or more embodiments. Prior to mounting the top die 140 on the bottom die 120, the top die 140 may be prepared in a manner similar to the manner described above for the semiconductor device 100 (e.g., see FIG. 2B). That is, the bonding layer 170 may be formed on the top die passivation layer 145 of the top die 140, and top die bonding pads 179 may be formed in openings in the bonding layer 170.

The top die 140 may then be placed on the bottom die 120 so that the top die bonding pads 179 are aligned with and contact the bottom die bonding pads 459. In particular, a centerline $C_{140}$ of the top die 140 may be substantially aligned in the z-direction with a centerline $C_{120}$ of the bottom die 120. A direct bonding process (e.g., hybrid bonding or SoIC bonding) may then be performed so as to bond the top die to the bottom die 120 by a direct bond (hybrid bond or SoIC bond) that includes an oxide-oxide bond between the bonding layer 170 and the bonding dielectric layer 150 and a metal-metal bond between the top die bonding pads 179 and the bottom die bonding pads 459.

FIG. 7G is a vertical cross-sectional view of the molding material layer 180 on the top die 140 and the bottom die 120, according to one or more embodiments. The molding material layer 180 may be formed, for example, by a compression molding process similar to the compression molding process described above for semiconductor device 100. As illustrated in FIG. 7G, the molding material layer 180 may be formed so as to bond securely to the top die sidewall 141 and bottom die sidewall 121. In addition, the molding material layer 180 may be formed so that the first lower face 180a of the molding material layer 180 is bonded securely to the bonding dielectric layer 150, and the second lower face 180b of the molding material layer 180 is bonded securely to the metal layer 605 (or, optionally to the bonding dielectric layer 150 if the metal layer 605 is not present).

Figure 7H:
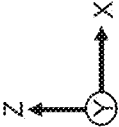
FIG. 7H is a vertical cross-sectional view of the intermediate structure including C4 bumps according to one or more embodiments.
Figure 71:
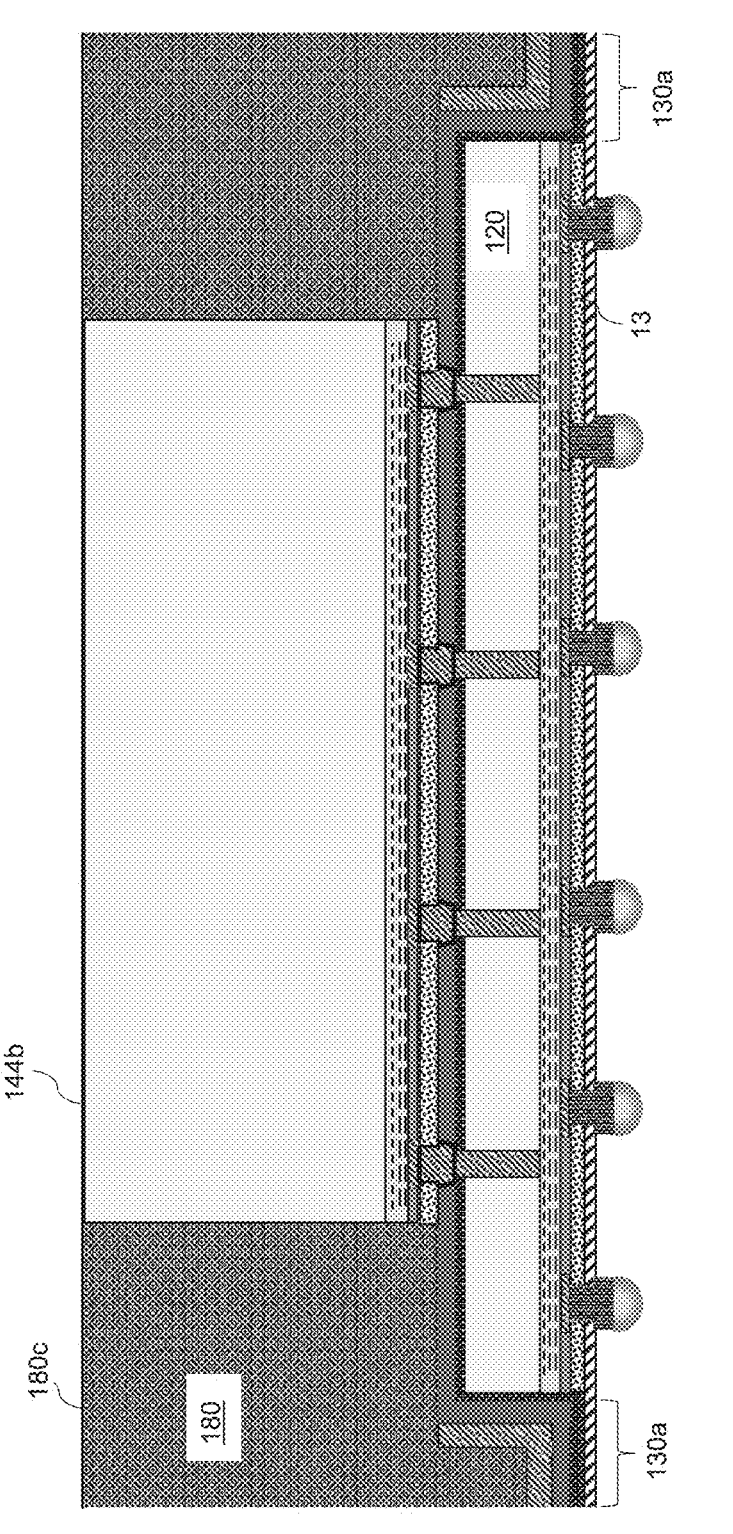

FIG. 7H is a vertical cross-sectional view of the intermediate structure including C4 bumps 139 according to one or more embodiments. Prior to forming the C4 bumps 139, the intermediate structure may be attached to a second carrier substrate 20 and then detached from the first carrier substrate 10 (including removal of the bonding film 12) as described above with respect to semiconductor device 100.

As illustrated in FIG. 7H, after removal of the first carrier substrate 10 and bonding film 12 (e.g., by grinding and CMP), a surface of the bonding layer 13 may be substantially coplanar with a surface of the gap fill layer 402. However, in at least one embodiment, due to a different polishing rate between the bonding layer 13 and gap fill layer 402, the bonding layer 13 may be slightly recessed. In that case, the surface of the bonding layer 13 may be slightly lower than the surface of the gap fill layer 402.

As illustrated in FIG. 7H, the protective layer 130 may be formed on the bonding layer 13 that remains on the bottom die passivation layer 125 of the bottom die 120. The protective layer 130 may also be formed on the portion of the gap fill layer 402 that extends laterally (e.g., in the x-direction and/or y-direction) away from the bottom die 120. As illustrated in FIG. 7H, a thickness of a portion of the protective layer 130 contacting the bonding layer 13 may be substantially the same as (or slightly greater than) a thickness of the portion of the protective layer 130 that contacts the gap fill layer 402 (e.g., on the second lower face 180b of the molding material layer 180). The C4 bumps 139 including copper pillars 139a and a solder layer 139b (e.g., solder balls) may then be formed on the bottom die contact pads 123 through openings in the protective layer 130 and bonding layer 13, as described above with respect to semiconductor device 100.

FIG. 7I is a vertical cross-sectional view of the intermediate structure after singulation and thinning the molding material layer 180 according to one or more embodiments. As illustrated in FIG. 7I, the second carrier substrate 20 may be removed, for example, by decomposing (e.g., by using heat, ultraviolet (UV) light, etc.) the adhesive layer that adheres the intermediate structure to the second carrier substrate D20. The molding material layer 180 may then be thinned so that the upper surface 180d of the molding material layer 180 is substantially coplanar with an upper surface 144b of the top die bulk semiconductor region 144. The molding material layer 180 may be thinned, for example, by grinding the molding material layer 180, for example, using a grinding wheel.

A singulation process may then be used to separate the semiconductor device 600 from surrounding material (e.g., molding material). For example, a dicing saw may be used to separate the semiconductor device 600. The singulation process may be performed to form the protective layer extending portion 130a that extends laterally (e.g., in the x-direction and/or y-direction). In particular, singulation may be performed so that the protective layer extending portion 130a extends laterally by a distance that is at least 5% of the width of the bottom die 120 in a direction of the distance.

Referring to FIGS. 1A-7I, a semiconductor device 100, 400, 600 may include a bottom semiconductor die 120 including a bottom semiconductor die sidewall 121, a top semiconductor die 140 bonded to the bottom semiconductor die 120 and including a top semiconductor die sidewall 141, and a molding material layer 180 formed on an upper surface of the bottom semiconductor die 120, on the top semiconductor die sidewall 141, and on the bottom semiconductor die sidewall 121.

In one embodiment, the molding material layer 180 may be formed around an entire periphery of the bottom semiconductor die 120 and around an entire periphery of the top semiconductor die 140. In one embodiment, a thickness of the top semiconductor die 140 may be greater than a thickness of the bottom semiconductor die 120. In one embodiment, a width of the top semiconductor die 140 may be less than a width of the bottom semiconductor die 120. In one embodiment, a width of the molding material layer 180 may be greater than a width of the bottom semiconductor die 120. In one embodiment, the molding material layer 180 may include a compression molding compound (CMC). In one embodiment, the bottom semiconductor die 120 may include a bottom semiconductor die face side including an active region, and a bottom semiconductor die back side opposite the bottom semiconductor die face side, the top semiconductor die 140 may include a top semiconductor die face side including an active region 142, and a top semiconductor die back side opposite the top semiconductor die face side, and the top semiconductor die face side faces the bottom semiconductor die back side. In one embodiment, the bottom semiconductor die 120 may include a plurality of through silicon vias (TSVs 190) for electrically coupling the top semiconductor die 140 to the bottom semiconductor die 120. In one embodiment, the semiconductor device 100, 400, 600 may further include a bonding dielectric layer 150 on the upper surface of the bottom semiconductor die 120, and an upper portion of the plurality of TSVs 190 may be in the bonding dielectric layer 150. In one embodiment, the semiconductor device 100, 400, 600 may further include an oxide bonding layer 170 on a lower surface of the top semiconductor die 140 and bonded to the bonding dielectric layer 150, and a plurality of top semiconductor die bonding pads 179 in the oxide bonding layer 170, and the plurality of top semiconductor die bonding pads 179 may contact the upper portion of the plurality of TSVs 190, respectively. In one embodiment, the bonding dielectric layer 150 may include a bonding dielectric layer sidewall portion contacting the bottom semiconductor die sidewall 121, and the molding material layer 180 contacts the bonding dielectric layer sidewall portion. In one embodiment, the semiconductor device 100, 400, 600 may further include a bonding dielectric layer 150 on the upper surface of the bottom semiconductor die 120, and a plurality of bottom semiconductor die bonding pads 459 in the bonding dielectric layer 150. wherein the plurality of bottom semiconductor die bonding pads 459 contact the plurality of TSVs 190, respectively. In one embodiment, the semiconductor device 100, 400, 600 may further include an oxide bonding layer 170 on a lower surface of the top semiconductor die 140 and bonded to an upper surface of the bonding dielectric layer 150, and a plurality of top semiconductor die bonding pads 179 in the oxide bonding layer 170, wherein the plurality of top semiconductor die bonding pads 179 contacts the plurality of bottom semiconductor bonding pads, respectively. In one embodiment, the semiconductor device 400, 600 may further include a gap fill layer 402 on the bottom semiconductor die 120, and the bonding dielectric layer 150 may be on the gap fill layer 402. In one embodiment, the gap fill layer 402 may include a gap fill layer sidewall portion contacting the bottom semiconductor die sidewall 121, and the molding material layer 180 may be on the gap fill layer sidewall portion. In one embodiment, the semiconductor device 600 may include a gap fill layer 402 on the bottom semiconductor die 120 and including a gap fill layer sidewall portion contacting the bottom semiconductor die sidewall 121, wherein a portion of the bonding dielectric layer 150 is on the gap fill layer sidewall portion, and a metal layer 605 on the portion of the bonding dielectric layer 150 on the gap fill layer sidewall portion, wherein the molding material layer 180 is on the metal layer 605.

Referring to FIGS. 1A-7I, a method of forming a semiconductor device 100, 400, 600 may include mounting a bottom semiconductor die 120 including a bottom semiconductor die sidewall 121 on a carrier substrate, mounting a top semiconductor die 140 including a top semiconductor die sidewall 141 on the bottom semiconductor die 120, and forming a molding material layer 180 on an upper surface of the bottom semiconductor die 120, on the top semiconductor die sidewall 141, and on the bottom semiconductor die sidewall 121.

In one embodiment, the method may further include forming a bonding dielectric layer 150 on the upper surface of the bottom semiconductor die 120, wherein the bonding dielectric layer 150 may include a bonding dielectric layer sidewall portion contacting the bottom semiconductor die sidewall 121, and the forming of the molding material layer 180 may include forming the molding material layer 180 to be contact the bonding dielectric layer sidewall portion. In one embodiment, the method may further include forming a gap fill layer 402 on the bottom semiconductor die 120, wherein the forming of the bonding dielectric layer 150 may include forming the bonding dielectric layer 150 on the gap fill layer 402. In one embodiment, the forming of the gap fill layer 402 may include forming the gap fill layer 402 so as to include a gap fill layer sidewall portion contacting the bottom semiconductor die sidewall 121, and wherein the forming of the molding material layer 180 may include forming the molding material layer 180 so as to be on the gap fill layer sidewall portion.

Referring to FIGS. 1A-7I, a semiconductor device 100, 400, 600 may include a bottom semiconductor die 120 including a plurality of through silicon vias (TSVs 190) and a bottom semiconductor die sidewall 121, a top semiconductor die 140 bonded to a central region of the bottom semiconductor die 120 and including a top semiconductor die sidewall 141, wherein the top semiconductor die 140 may be electrically coupled to the plurality of TSVs 190, a thickness of the top semiconductor die 140 may be at least twice a thickness of the bottom semiconductor die 120, and a width of the top semiconductor die 140 may be less than 80% of a width of the bottom semiconductor die 120, a bonding dielectric layer 150 on the upper surface of the bottom semiconductor die 120, an oxide bonding layer 170 on a lower surface of the top semiconductor die 140 and bonded to the bonding dielectric layer 150, a plurality of top semiconductor die bonding pads 179 in the oxide bonding layer 170, wherein the plurality of top semiconductor die bonding pads 179 may be electrically coupled to the plurality of TSVs 190, respectively, and a molding material layer 180 formed on an upper surface of the bottom semiconductor die 120, on the top semiconductor die sidewall

141, and on the bottom semiconductor die sidewall 121, wherein a width of the molding material layer 180 may be greater than a width of the bottom semiconductor die 120.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a bottom semiconductor die including a bottom semiconductor die sidewall;
   a top semiconductor die bonded to the bottom semiconductor die and including a top semiconductor die sidewall;
   a dielectric layer on the bottom semiconductor die and covering the bottom semiconductor die sidewall; and
   a molding material layer formed on an upper surface of the bottom semiconductor die, on the top semiconductor die sidewall, and on the dielectric layer, wherein the dielectric layer is between the molding material layer and the bottom semiconductor die sidewall.

2. The semiconductor device of claim 1, wherein the molding material layer is formed around an entire periphery of the bottom semiconductor die and around an entire periphery of the top semiconductor die.

3. The semiconductor device of claim 1, wherein a thickness of the top semiconductor die is greater than a thickness of the bottom semiconductor die.

4. The semiconductor device of claim 1, wherein a width of the top semiconductor die is less than a width of the bottom semiconductor die.

5. The semiconductor device of claim 1, wherein a width of the molding material layer is greater than a width of the bottom semiconductor die.

6. The semiconductor device of claim 1, wherein the molding material layer comprises a compression molding compound (CMC).

7. The semiconductor device of claim 1, wherein the bottom semiconductor die includes a bottom semiconductor die face side including an active region, and a bottom semiconductor die back side opposite the bottom semiconductor die face side,
   wherein the top semiconductor die includes a top semiconductor die face side including an active region, and a top semiconductor die back side opposite the top semiconductor die face side, and
   wherein the top semiconductor die face side faces the bottom semiconductor die back side.

8. The semiconductor device of claim 1, wherein the bottom semiconductor die comprises a plurality of through silicon vias (TSVs) for electrically coupling the top semiconductor die to the bottom semiconductor die.

9. The semiconductor device of claim 8, wherein the dielectric layer comprises a bonding dielectric layer on the upper surface of the bottom semiconductor die, and an upper portion of the plurality of TSVs are in the bonding dielectric layer.

10. The semiconductor device of claim 9, further comprising:
   an oxide bonding layer on a lower surface of the top semiconductor die and bonded to the bonding dielectric layer; and
   a plurality of top semiconductor die bonding pads in the oxide bonding layer, wherein the plurality of top semiconductor die bonding pads contact the upper portion of the plurality of TSVs, respectively.

11. The semiconductor device of claim 9, wherein the bonding dielectric layer comprises a bonding dielectric layer sidewall portion covering the bottom semiconductor die sidewall, and the molding material layer covering the bonding dielectric layer sidewall portion.

12. The semiconductor device of claim 8, wherein the dielectric layer comprises a bonding dielectric layer on the upper surface of the bottom semiconductor die and the semiconductor device further comprises:
   a plurality of bottom semiconductor die bonding pads in the bonding dielectric layer, wherein the plurality of bottom semiconductor die bonding pads contact the plurality of TSVs, respectively.

13. The semiconductor device of claim 12, further comprising:
   an oxide bonding layer on a lower surface of the top semiconductor die and bonded to an upper surface of the bonding dielectric layer; and
   a plurality of top semiconductor die bonding pads in the oxide bonding layer, wherein the plurality of top semiconductor die bonding pads contacts the plurality of bottom semiconductor bonding pads, respectively.

14. The semiconductor device of claim 1, wherein the dielectric layer comprises a gap fill layer on the bottom semiconductor die and including a gap fill layer sidewall portion covering the bottom semiconductor die sidewall, wherein the molding material layer is on the gap fill layer sidewall portion.

15. The semiconductor device of claim 1, wherein the dielectric layer comprises a gap fill layer on the bottom semiconductor die and including a gap fill layer sidewall portion covering the bottom semiconductor die sidewall and a bonding dielectric layer including a portion on the gap fill layer sidewall portion, and the semiconductor device further comprises:
   a metal layer on the portion of the bonding dielectric layer on the gap fill layer sidewall portion, wherein the molding material layer is on the metal layer.

16. A method of forming a semiconductor device, the method comprising:
   mounting a bottom semiconductor die including a bottom semiconductor die sidewall on a carrier substrate;
   mounting a top semiconductor die including a top semiconductor die sidewall on the bottom semiconductor die;
   forming a dielectric layer on the bottom semiconductor die and over the bottom semiconductor die sidewall; and
   forming a molding material layer on an upper surface of the bottom semiconductor die, on the top semiconductor die sidewall, and on the dielectric layer such that the dielectric layer is between the molding material layer and the bottom semiconductor die sidewall.

17. The method of claim 16, wherein the forming of the dielectric layer comprises forming a bonding dielectric layer on the upper surface of the bottom semiconductor die, wherein the bonding dielectric layer comprises a bonding dielectric layer sidewall portion covering the bottom semiconductor die sidewall, and the forming of the molding material layer comprises forming the molding material layer to be in contact the bonding dielectric layer sidewall portion.

18. The method of claim 16, wherein the forming of the dielectric layer comprises forming a gap fill layer on the bottom semiconductor die and including a gap fill layer sidewall portion over the bottom semiconductor die sidewall, and the forming of the molding material layer comprises forming the molding material layer to be in contact with the gap fill layer sidewall portion.

19. The method of claim 16, wherein the forming of the dielectric layer comprises forming a gap fill layer comprises forming the gap fill layer so as to include a gap fill layer sidewall portion covering the bottom semiconductor die sidewall, and forming a bonding dielectric layer including a portion on the gap fill layer sidewall portion, and the method further comprises:

forming a metal layer on the portion of the bonding dielectric layer on the gap fill layer sidewall portion, wherein the forming of the molding material layer comprises forming the molding material layer to be in contact with the metal layer.

20. A semiconductor device, comprising:

a bottom semiconductor die including a plurality of through silicon vias (TSVs) and a bottom semiconductor die sidewall;

a top semiconductor die bonded to a central region of the bottom semiconductor die and including a top semiconductor die sidewall, wherein the top semiconductor die is electrically coupled to the plurality of TSVs, a thickness of the top semiconductor die is at least twice a thickness of the bottom semiconductor die, and a width of the top semiconductor die is less than 80% of a width of the bottom semiconductor die;

a dielectric layer on the bottom semiconductor die and over the bottom semiconductor die sidewall;

an oxide bonding layer on a lower surface of the top semiconductor die and bonded to the bonding dielectric layer;

a plurality of top semiconductor die bonding pads in the oxide bonding layer, wherein the plurality of top semiconductor die bonding pads are electrically coupled to the plurality of TSVs, respectively; and a molding material layer formed on an upper surface of the bottom semiconductor die, on the top semiconductor die sidewall, and on the dielectric layer, wherein the dielectric layer is between the molding material layer and the bottom semiconductor die sidewall and a width of the molding material layer is greater than a width of the bottom semiconductor die.

* * * * *